(12) United States Patent
Ding et al.

(10) Patent No.: US 9,800,176 B2
(45) Date of Patent: Oct. 24, 2017

(54) TNPC INVERTER DEVICE AND METHOD FOR DETECTING SHORT-CIRCUIT THEREOF

(71) Applicant: DELTA ELECTRONICS (SHANGHAI) CO., LTD., Shanghai (CN)

(72) Inventors: Xibing Ding, Shanghai (CN); Weiyi Feng, Shanghai (CN); Weiqiang Zhang, Shanghai (CN); Hongyang Wu, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 208 days.

(21) Appl. No.: 14/730,469

(22) Filed: Jun. 4, 2015

(65) Prior Publication Data
US 2015/0357935 A1  Dec. 10, 2015

(30) Foreign Application Priority Data

Jun. 6, 2014  (CN) .......................... 2014 1 0251114

(51) Int. Cl.
*H02M 1/08* (2006.01)
*H02M 1/32* (2007.01)
(Continued)

(52) U.S. Cl.
CPC ............ *H02M 7/537* (2013.01); *H02M 1/08* (2013.01); *H02M 1/32* (2013.01); *H02M 7/487* (2013.01); *H03K 17/0828* (2013.01); *H02M 2001/0006* (2013.01); *H03K 2217/0027* (2013.01)

(58) Field of Classification Search
CPC .......... H02M 7/04; H02M 7/12; H02M 7/217; H02M 7/219; H02M 7/42; H02M 7/44;
(Continued)

(56) References Cited

U.S. PATENT DOCUMENTS

| 5,621,628 A | 4/1997 | Miyazaki et al. |
| 2011/0051478 A1* | 3/2011 | Sato .................. H02J 9/062 363/123 |

(Continued)

FOREIGN PATENT DOCUMENTS

| CN | 102937688 A | 2/2013 |
| CN | 103312210 A | 9/2013 |
| CN | 103368427 A | 10/2013 |

OTHER PUBLICATIONS

Device application Technology Dept., Fuji Electric co.,Ltd., "Evaluation Driver Board for AT-NPC 3-level 4in1 IGBT module", Fuji Electric Innovationg Energy Technology, Application Note-PRELIMINARY, AN-125, ver1.0, Dec. 2013, pp. 1-23.
(Continued)

*Primary Examiner* — Timothy J Dole
*Assistant Examiner* — Ivan Laboy Andino
(74) *Attorney, Agent, or Firm* — Yunling Ren

(57) ABSTRACT

The present application discloses a TNPC inverter device, comprising: a TNPC inverter module and a short circuit detecting module. The TNPC module at least comprises an inverting bridge arm and a bi-directional switching bridge arm. The inverting bridge arm comprises at least two switches connected in series; the bi-directional switching bridge arm comprises at least two switches. The short circuit detecting module mainly consists of two switch detecting unit corresponding to the two switches in the inverting bridge arm respectively. Increasing the voltage drop of the switches in the inverting bridge when a short circuit occurs in the TNPC module by some way, then it could realize the short circuit detecting module is able to detect all the paths of the short circuit in the TNPC module to simplify the peripheral circuit of the TNPC module in the TNPC inverter device.

14 Claims, 17 Drawing Sheets

(51) Int. Cl.
*H02M 7/487* (2007.01)
*H03K 17/082* (2006.01)
*H02M 7/537* (2006.01)
*H02M 1/00* (2006.01)

(58) Field of Classification Search
CPC ........ H02M 7/48; H02M 7/483; H02M 7/487; H02M 7/537; H02M 7/5387; H02M 1/08; H02M 1/32; H02M 2001/0006; H03K 17/0822; H03K 17/0826; H03K 17/0828; H03K 2217/0027
USPC ... 363/16–17, 34–43, 50–57, 84, 89, 95–98, 363/125, 127, 131–132, 135–136; 361/18
See application file for complete search history.

(56) References Cited

U.S. PATENT DOCUMENTS

| | | | |
|---|---|---|---|
| 2011/0242860 A1* | 10/2011 | Takizawa | H01L 23/645 363/62 |
| 2012/0018777 A1* | 1/2012 | Takizawa | H02M 1/32 257/140 |
| 2012/0161858 A1 | 6/2012 | Permuy et al. | |
| 2014/0247634 A1* | 9/2014 | Takizawa | H02M 1/32 363/132 |
| 2015/0003127 A1* | 1/2015 | Takizawa | H02M 1/32 363/50 |

OTHER PUBLICATIONS

Siani, Alain, "AN2012-03 F3L2020E07-F-P EVAL Evaluation Driver Board for EconoPACK TM 4 3-Level Modules in NPC2-Topology with 1ED020112-B2 gate driver IC", Application Note AN 2012-03, V1.1, Feb. 2014, pp. 1-19.

Arlt, Bodo, "Electronics in Motion and Conversion", Bodo's Power Systems, ISSN: 1863-5598, ZKZ 64717 05-12, May 2012, pp. 1-103.

European search report dated Jan. 5, 2016 from corresponding No. EP 15170742.9.

1st OA dated May 4, 2017 by the CN Office.

\* cited by examiner

TNPC INVERTER DEVICE AND METHOD FOR DETECTING SHORT-CIRCUIT THEREOF

CROSS REFERENCE TO RELATED APPLICATIONS

The present application claims priority under 35 U.S.C. §119 to Chinese Patent Applications No. 201410251114.3, filed on Jun. 6, 2014, the entire contents of which are incorporated herein by reference.

TECHNICAL FIELD

The present application generally relates to a T-type neutral point clamped (TNPC) inverter device, and a method for detecting a short-circuit in such a TNPC inverter device.

BACKGROUND

As the development of high power electronics and electric devices towards high frequency, high power density, high reliability, and low cost gradually, inverter topologies widely applied in devices such as an uninterruptible power supply (UPS), an active power filter (APF) and a static var generator (SVG), become the hotspot of researching.

Currently, the widely used inverter topologies are, for example, T-type neutral point clamped (TNPC) topologies and diode neutral point clamped (DNPC) topologies, which exhibit different advantages in different applications. Since the TNPC topology has a relatively low loss in middle frequency bands, and has a relatively short commutation path during reactive power period, the TNPC topology is gradually applied in different electronics and electric devices.

Reliability is one of important indexes for evaluating the quality of electronics and electric devices, and the reliability of high power electronics and electric devices is especially important. Thereby, in order to improve the reliability of devices, different methods for detecting a straight-through short-circuit in a bridge arm of an inverter are proposed with respect to different inverter topologies.

The existing methods for detecting a straight-through short-circuit in a bridge arm of a TNPC inverter are mainly achieved by detecting a de-saturation of a voltage applied on a switch in the inverter, for example, with respect to an insulated gate bipolar transistor (IGBT) type switch, detecting whether a voltage Vce between a collector and an emitter thereof quits the saturation state. FIG. 1A is a schematic diagram illustrating a principle of detecting a de-saturation of a switch voltage Vce. For ease of explanation, An IGBT is taken as an example here, and the same as below.

As shown in FIG. 1A, the abscissa is the voltage Vce between the collector and the emitter of the switch, the ordinate is a current Ic of the collector of the switch, a plurality of solid curves are characteristic curves of the switch with respect to different gate voltages (i.e., a static driving voltage of the IGBT), the left and right sides of a dotted curve respectively illustrate a so-called saturation region and a linear region, and the same as below. When the switch (i.e., the IGBT) operates normally, its operating current (such as rated current) Inormal is relative small. For example, when the static driving voltage Vge of the IGBT is 15V, the switch operates at a point P1 on the characteristic curve corresponding to the static driving voltage Vge of 15V, which is in the saturation region. At this time, the voltage Vce between the collector and the emitter of the switch is relatively low, generally is 2~3V.

When a straight-through short-circuit occurs in an inverter, a short current Isc flowing through a switch in the inverter is relative large, which is generally 4~7 times of the rated current of the switch, i.e., Isc=(4~7)×Inormal. For example, at this time, the switch operates at a point P2 on the characteristic curve corresponding to the static driving voltage Vge of 15V, which is in the linear region. At this time, the voltage Vce between the collector and the emitter of the switch is higher than that during the normal operation. The drift of an operating point of the switch from P1 to P2 is generally called as a de-saturation of the voltage Vce between the collector and the emitter of the switch, which is abbreviated as Vce de-saturation, and the same as below. In this way, whether a straight-through short-circuit occurs in the inverter can be determined by detecting the Vce de-saturation.

FIG. 1B is a schematic diagram illustrating a circuit for detecting a de-saturation of the switch voltage Vce in the related art. The connection relationships among individual elements comprised in the circuit for detecting the de-saturation of the switch voltage Vce in the related art are shown in FIG. 1B. When no straight-through occurs in the bridge arm, at which the switch S is located, of the inverter, a weak current of a current source Isource is discharged by a resistor R, a diode Da, a diode Db and a switch S which are connected in serial in turn, no relatively high voltage can be accumulated across the two terminals of a capacitor C, and thus a voltage on a positive terminal of the capacitor C, i.e., a point B, is not high enough to trigger a comparator (i.e., an operational amplifier) A. Here, a diode D which is anti-parallelly connected with the switch S does not participate in the detection.

When the voltage Vce between the collector and the emitter of the switch S satisfies: Vce is greater than a voltage obtained by subtracting a threshold voltage of the diode Da and a threshold voltage of the diode Db from 7V, i.e., is greater than about 5.6V (since the threshold voltage of the diode Da or Db is generally 0.7V, and a voltage drop on the resistor R may be ignored), the voltage on the positive terminal of the capacitor, i.e., point B, is increased for the capacitor C is constantly charged by the current source Isource, and when the voltage on the point B is greater than 7V, the comparator A is inverted and an output terminal O thereof outputs a high level, thereby, whether a straight-through occurs in the bridge arm, at which the switch S is located, of the inverter may be detected. Here, the signs "+" and "−" on the two sides of the switch S represent that the voltage at this time is up positive and down negative.

The existing methods for detecting a straight-through in a bridge arm or short-circuit in a TNPC inverter described with reference to FIGS. 1A and 1B are used in inverter circuits of various existing TNPC topologies. For example, FIG. 1C is a schematic diagram illustrating an inverter circuit of a TNPC topology, FIG. 1D is a schematic diagram illustrating an inverter circuit of another TNPC topology, FIG. 1E is a schematic diagram illustrating an inverter circuit of further another TNPC topology, and FIG. 1F is a schematic diagram illustrating an inverter circuit of still another TNPC topology. The connection relationships among individual elements comprised in the inverter circuits of the TNPC topologies are shown in FIGS. 1C, 1D, 1E and 1F. Direct voltage sources V1 and V2 connected in series in the same direction constitute a DV source, the signs "+" and "−" respectively represent a positive DV terminal and a negative DV terminal of the DV; G is a grounding terminal, and is also a midpoint of the DV source; switches S1 and S2 connected in series in the same direction constitute an inverting bridge arm, The collector of the switch S1 is connected to the positive DV terminal, the emitter of the switch S2 is connected to the negative DV terminal, diodes D1 and D2, which are anti-parallelly connected with the switches S1 and S2 respectively, are used for free-wheel or commutation, a connection point Oac between the switches S1 and S2 is an AC (alternative current) terminal; a bi-directional switching bridge arm is connected between the midpoint G and an AC terminal Oac, the bi-directional switching bridge arm can be formed by two switches connected in reverse parallel (i.e. anti-parallelly) or in reverse series, so as to achieve the free-wheel or commutation on two directions. For example, in FIG. 1C, switches S3 and S4 are connected in reverse series and are respectively anti-parallelly connected with diodes D3 and D4; in FIG. 1D, switches S13 and S14 are connected in reverse series and are respectively anti-parallelly connected with diodes D13 and D14; in FIG. 1E, switches S23 and S24 are anti-parallelly connected and are correspondingly connected with diodes D23 and D24 in reverse series; and in FIG. 1F, the switches S33 and S34 are anti-parallelly connected and are correspondingly connected with diodes D33 and D34 in reverse series.

Taking the TNPC topology type shown in FIG. 1C as an example, FIG. 1G is a schematic diagram illustrating a block diagram of a device for detecting a straight-through in a bridge arm of a TNPC inverter in the related art. All the switches S1~S4 shown in FIG. 1G as a whole are encapsulated in one plastic package, and the detection circuit achieves the detection by being connected to pins of the packaged TNPC module. In the conventional technology, in order to detect whether a short-circuit occurs in the TNPC module, at least four detection circuits X1, X2, X3 and X4 need to be constructed to correspond to the switches S1, S2, S3 and S4 comprised in the packaged TNPC module. The four detection circuits respectively detect the switches connected thereto. Therefore, for power supply devices equipped with such a TNPC module, detection circuits surrounding the packaged TNPC module will be relatively complex, and occupy a relatively large area of its circuit board. Furthermore, when there are too many detection circuits, the probability of false operation due to interruption by peripheral circuits tends to be increased.

SUMMARY

The present disclosure is made by considering at least a part of the above problems.

One object of the present disclosure is to provide a TNPC inverter device, including: a TNPC inverter module including a first DC terminal, a second DC terminal, an AC terminal, a capacitor bridge arm, an inverting bridge arm and a bi-directional switching bridge arm, wherein ends of the capacitor bridge arm and ends of the inverting bridge arm are correspondingly connected to the first DC terminal and the second DC terminal, ends of the bi-directional switching bridge arm are correspondingly connected to a midpoint of the capacitor bridge arm and a midpoint of the inverting bridge arm, the AC terminal is the midpoint of the inverting bridge arm, and the inverting bridge arm includes an upper switch unit and a lower switch unit; and a short-circuit detecting module mainly consisting of an upper switch detecting unit and a lower switch detecting unit, wherein the upper switch detecting unit is configured to detect a voltage drop of the upper switch unit, and the lower switch detecting unit is configured to detect a voltage drop of the lower switch unit.

Another object of the present disclosure is to provide a method for detecting a short-circuit in a TNPC inverter device, wherein the TNPC inverter device includes: a TNPC inverter module including a first DC terminal, a second DC terminal, an AC terminal, a capacitor bridge arm, an inverting bridge arm and a bi-directional switching bridge arm, wherein ends of the capacitor bridge arm and ends of the inverting bridge arm are correspondingly connected to the first DC terminal and the second DC terminal, ends of the bi-directional switching bridge arm are correspondingly connected to a midpoint of the capacitor bridge arm and a midpoint of the inverting bridge arm, the AC terminal is the midpoint of the inverting bridge arm, and the inverting bridge arm includes an upper switch unit and a lower switch unit; and a short-circuit detecting module mainly consisting of an upper switch detecting unit and a lower switch detecting unit, wherein the upper switch detecting unit is configured to detect a voltage drop of the upper switch unit, and the lower switch detecting unit is configured to detect a voltage drop of the lower switch unit, wherein the method for detecting a short-circuit in a TNPC inverter device includes: detecting only voltage drops of the upper switch unit and the lower switch unit in the TNPC inverter module of the TNPC inverter device; and determining that a short-circuit occurs in a loop at which one of the upper switch unit and the lower switch unit or both are located, when the voltage drop of the upper switch unit or the lower switch unit is greater than a reference value.

The present application performs a priority-ranked de-saturation to the switches in the inverting bridge arms of the TNPC inverter device, and the voltage Vce between the collector and the emitter of the switch in the inverting bridge arm of the TNPC inverter device is increased, thereby only by detecting the voltage Vce between the collector and the emitter of the switch in the inverting bridge arm of the TNPC inverter device, the short-circuit in the loop of the TNPC inverter device may be detected reliably. Furthermore, since in the present disclosure, only the voltage Vce between the collector and the emitter of the switch in the inverting bridge arm of the TNPC inverter device is detected, the number of the detecting circuits is reduced greatly, and thus the circuit is simple, with few components, and the cost is lower.

BRIEF DESCRIPTION OF THE DRAWINGS

The above and other purposes, features and other advantages of the present application will become more distinct and pellucid from the following detailed depiction in combination with the accompanying drawings, where.

DETAILED DESCRIPTION

Hereafter, the present application will be described in detail in combination with FIGS. 2A~6, wherein the same reference signs indicate the same or similar devices or signals. In addition, if there is a cross point appears on line segments functioning as connecting wires, a black spot "•" on the cross point indicates that the cross point is a connecting point. Meanwhile, symbols of respective components not only represent the components per se, but also represent the volumes of these components.

Figure 1A:
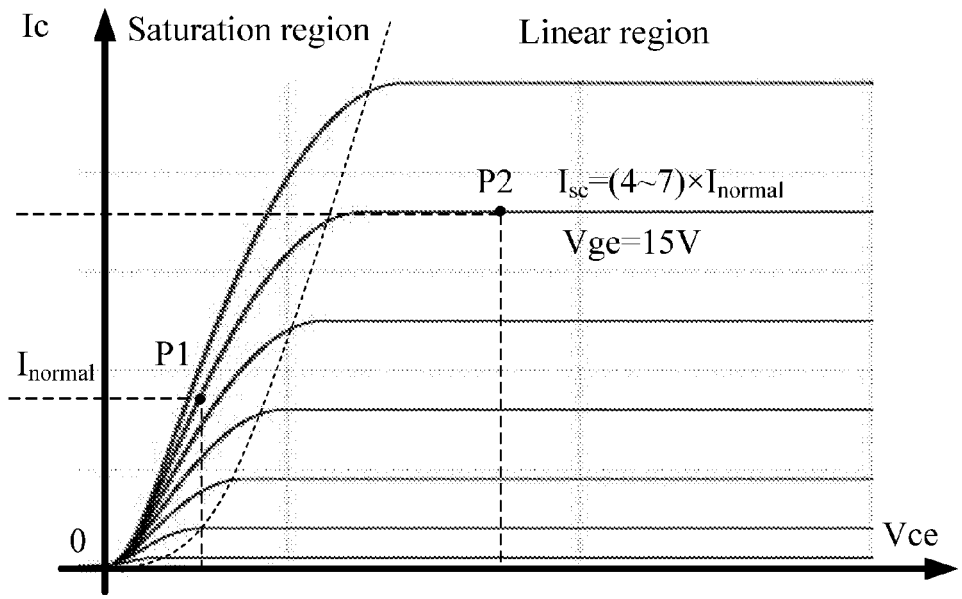
FIG. 1A is a schematic diagram illustrating a principle of operation of a switch.
Figure 1B:
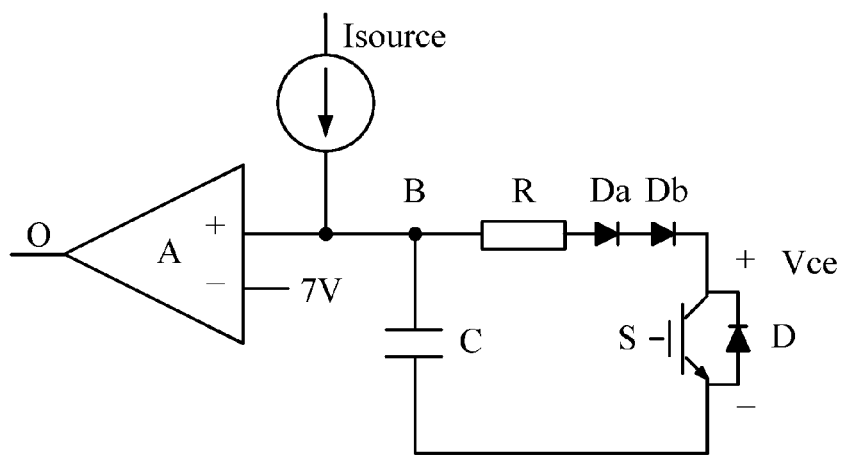
FIG. 1B is a schematic diagram illustrating a circuit for detecting the voltage of the switch voltage Vice in the related art.
Figure 1C:
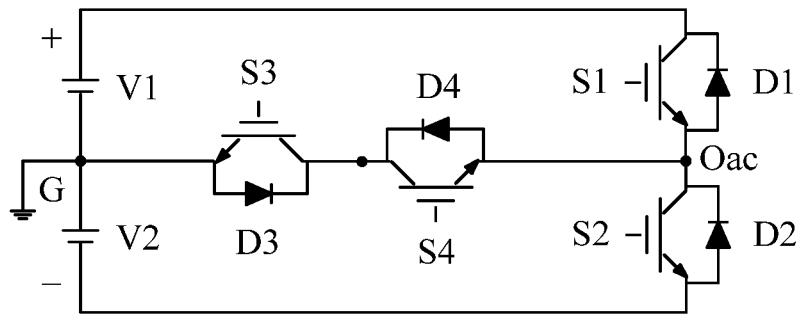
FIG. 1C is a schematic diagram illustrating an inverter circuit of a TNPC topology.
Figure 1D:
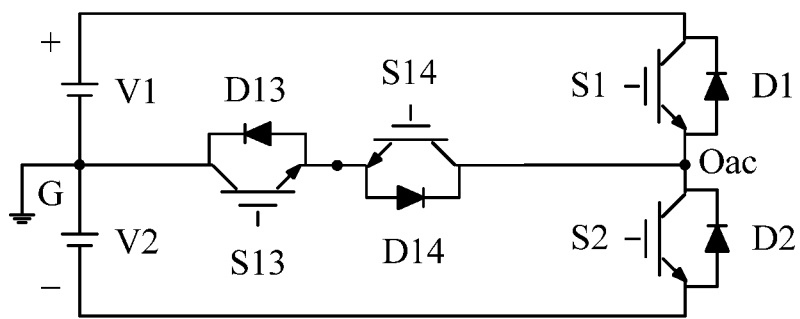
FIG. 1D is a schematic diagram illustrating an inverter circuit of another TNPC topology.
Figure 1E:
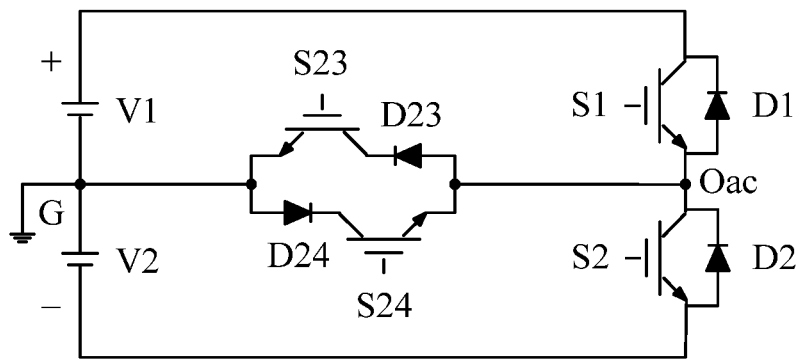
FIG. 1E is a schematic diagram illustrating an inverter circuit of further another TNPC topology.
Figure 1F:
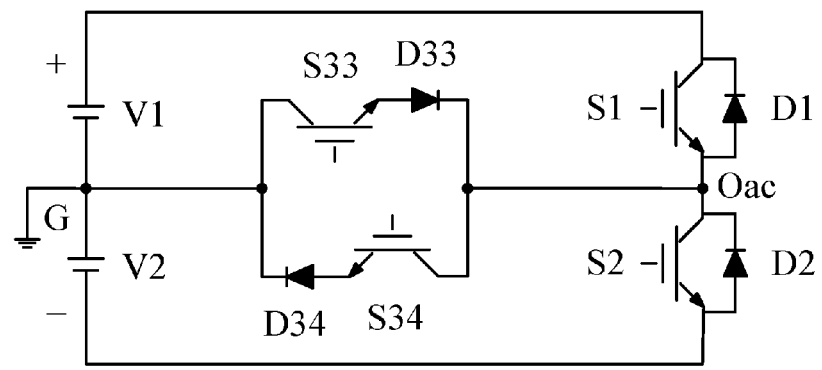
FIG. 1F is a schematic diagram illustrating an inverter circuit of still another TNPC topology.
Figure 1G:
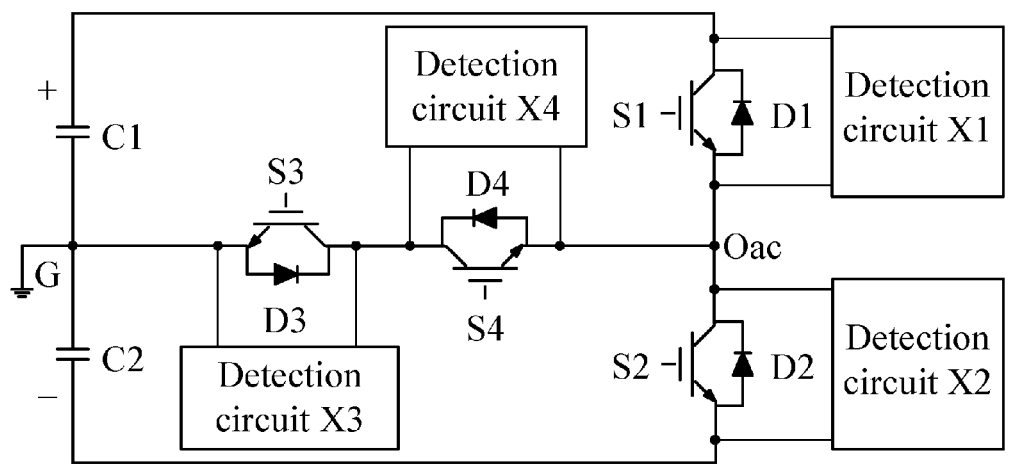
FIG. 1G is a schematic diagram illustrating a block diagram of a device for detecting a short-circuit in a TNPC inverter in the related art.
Figure 2A:
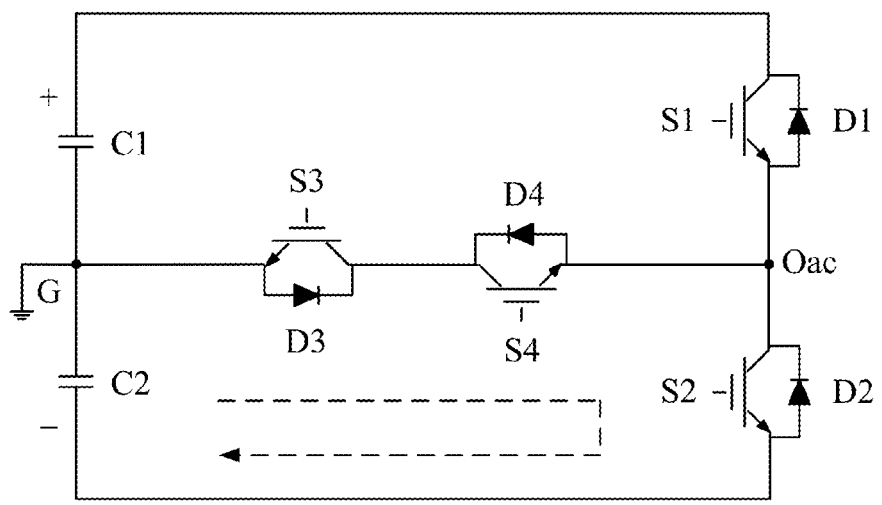
FIG. 2A is a schematic diagram illustrating a path of the short-circuit in the TNPC inverter.
Figure 2B:
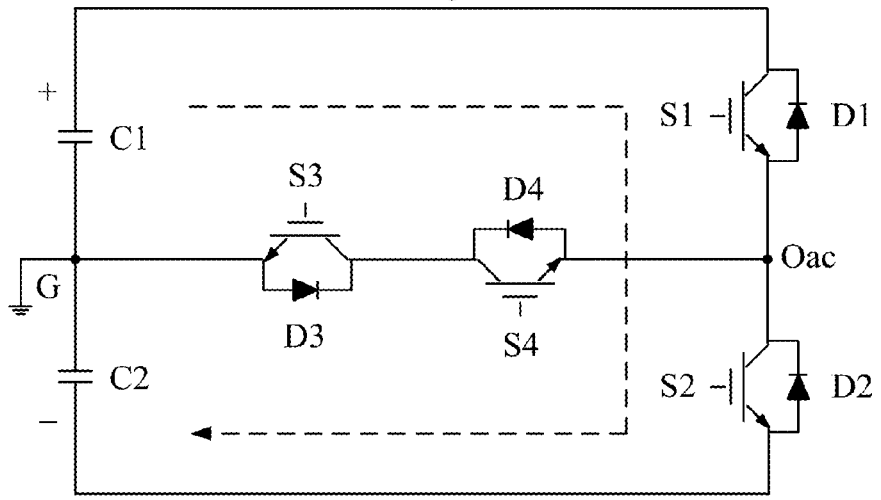
FIG. 2B is a schematic diagram illustrating another path of the short-circuit in the TNPC inverter.
Figure 2C:
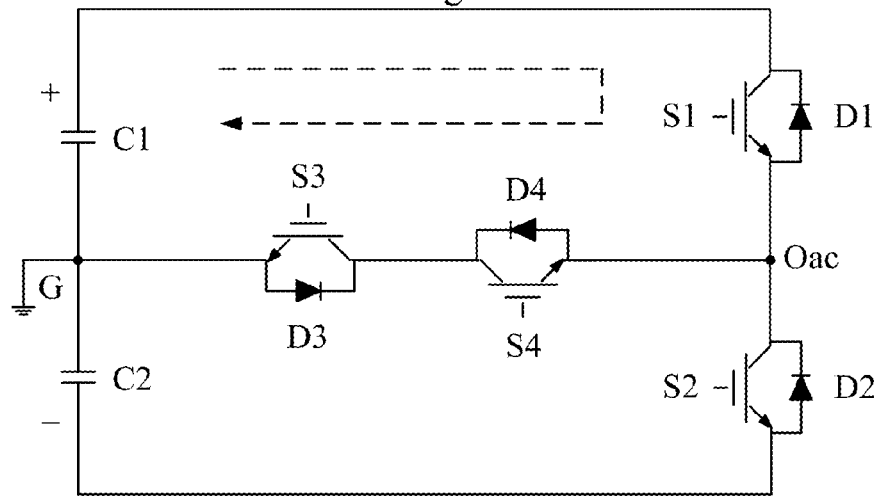
FIG. 2C is a schematic diagram illustrating further another path of the short-circuit in the TNPC inverter.

For the convenience of describing the present application, taking the topology type shown in FIG. 1C as an example, there are three paths of short-circuit in the TNPC inverter. FIG. 2A is a schematic diagram illustrating a path of the short-circuit in the TNPC inverter. FIG. 2B is a schematic diagram illustrating another path of the short circuit in the TNPC inverter. FIG. 2C is a schematic diagram illustrating further another path of the short circuit in the TNPC inverter. Since DV sources V1 and V2 in FIG. 1C supplying power is equivalent to capacitors having tremendous volumes discharging, for the convenience of illustration, in FIGS. 2A~2C, the two terminals of the capacitor bridge arm consisting of capacitors C1 and C2 is used to seem as DV sources V1 and V2 in FIG. 1C.

As shown in FIG. 2A, the dotted line with an arrow indicates that a short current flows through a midpoint G of the capacitor bridge arm, a diode D3, a switch S4, a switch S2, and a negative DC terminal "−". As shown in FIG. 2B, the dotted line with an arrow indicates that a short current flows through a positive DC terminal "+", a switch S1, a switch S2, and the negative DC terminal "−". As shown in FIG. 2C, the dotted line with an arrow indicates that a short current flows through a positive DC terminal "+", the switch S1, a diode D4, a switch S3, and the midpoint G of the capacitor bridge arm.

For the TNPC inverter having the topology type shown in FIGS. 1C~2C, the applicant notices that the common feature of the short circuits in the TNPC inverter lies in that the short currents flow through the switch S1 or the switch S2 in the inverting bridge arm, or flow through the switch S1 and the switch S2 in the inverting bridge arm at the same time.

Figure 2D:
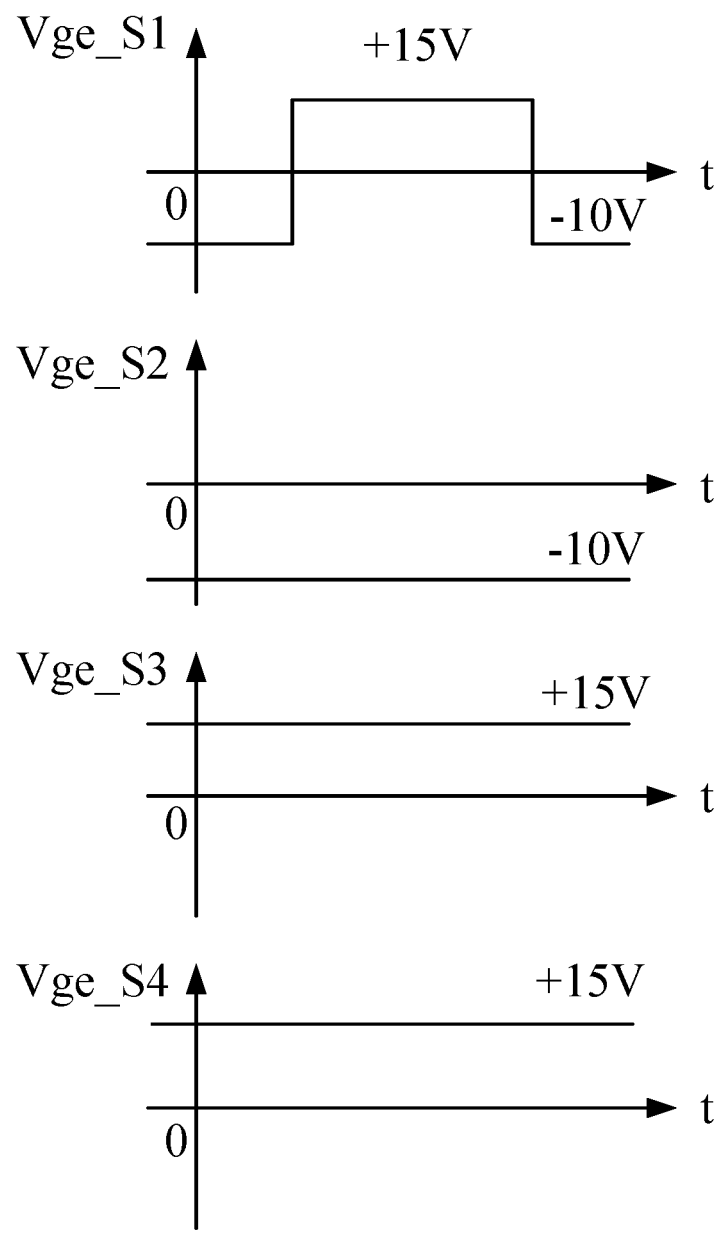
FIG. 2D is a schematic diagram illustrating waveforms for driving the switches, which lead to the short-circuit path in FIG. 2C.

In particular, taking FIG. 2C as an example, different manners of driving waves for the switches of the inverter, i.e., the waveforms for driving the switches could cause the same short circuit in the TNPC inverter. FIG. 2D is a schematic diagram illustrating one kind of waveforms for driving the switches, which lead to the short-circuit path in FIG. 2C. The waveforms of driving voltages Vge_S1, Veg_S2, Veg_S3 and Veg_S4 of the switches S1~S4 varying with time are respectively shown in FIG. 2D. Before the switch S1 turns on, the switch S3 turns on due to a wrong driving waveform. When a turning-on signal of the switch S1 is coming, a short current flowing through the positive DC terminal "+", the switch S1, the diode D4, the switch S3, and the midpoint G of the capacitor bridge arm is formed.

Figure 2E:
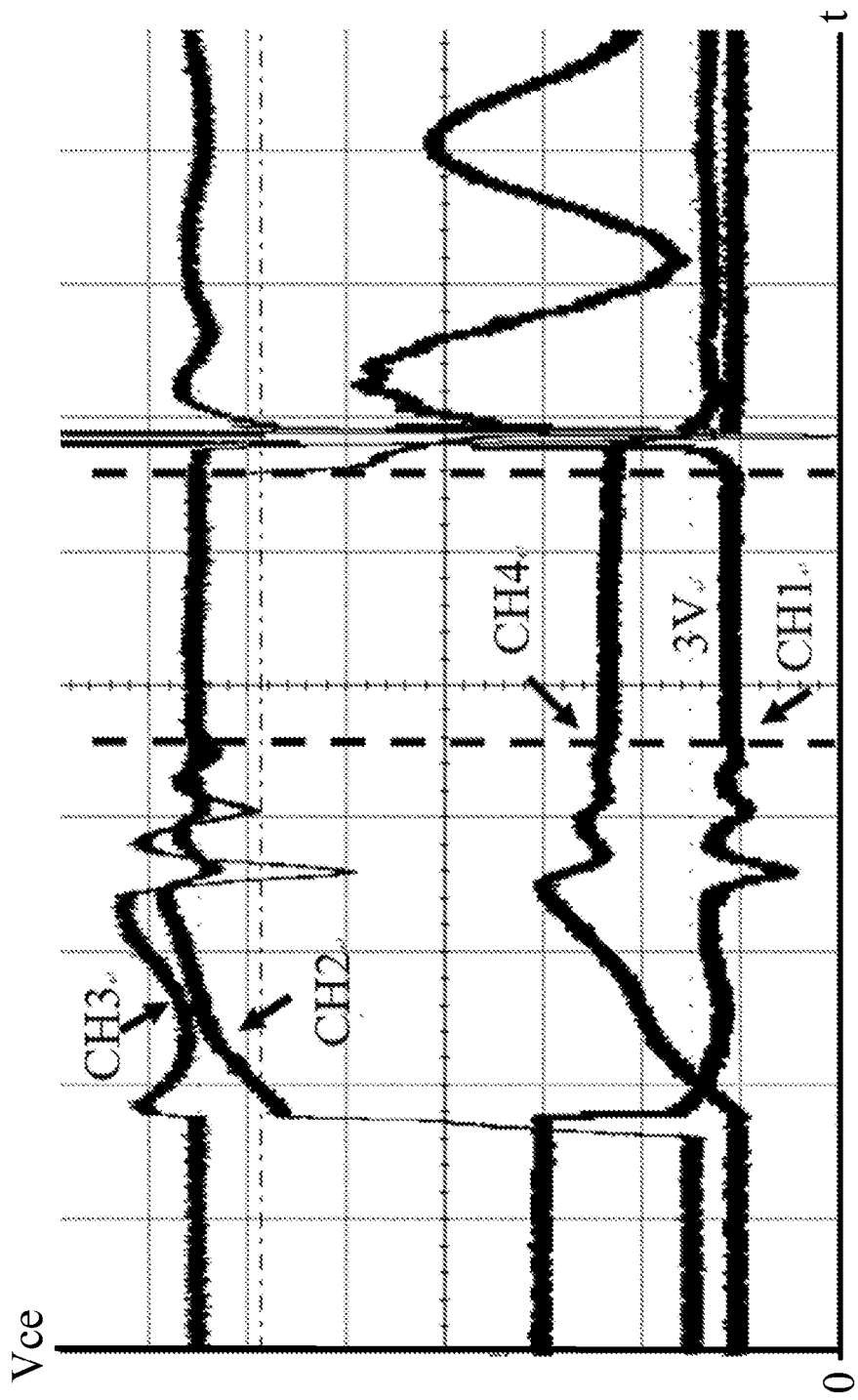
FIG. 2E is a schematic diagram illustrating experiment waveforms corresponding to circumstances of FIGS. 2C and 2D.

FIG. 2E is a schematic diagram illustrating experiment waveforms to perform the operation illustrated in FIGS. 2C and 2D, wherein CH1 is a waveform of a voltage Vice (50V/div) between a collector and an emitter of the switch S1, CH2 is a waveform of a driving voltage Vge_S1 (5V/div) of the switch S1, CH3 is a waveform of a driving voltage Vge_S3 (5V/div) of the switch S3, and CH4 is an experiment waveform of the short current Ic (1 kA/div) of the short-circuit path. As shown in FIG. 2E, during the time of a short-circuit detection shown between two vertical dotted lines, the voltage Vce_S1 between the collector and the emitter of the switch S1 is only about 3V, which is insufficient for, e.g., the aforesaid circuit X1 for detecting Vce de-saturation, to correctly determine whether a short circuit occurs in the bridge arm.

Figure 2F:
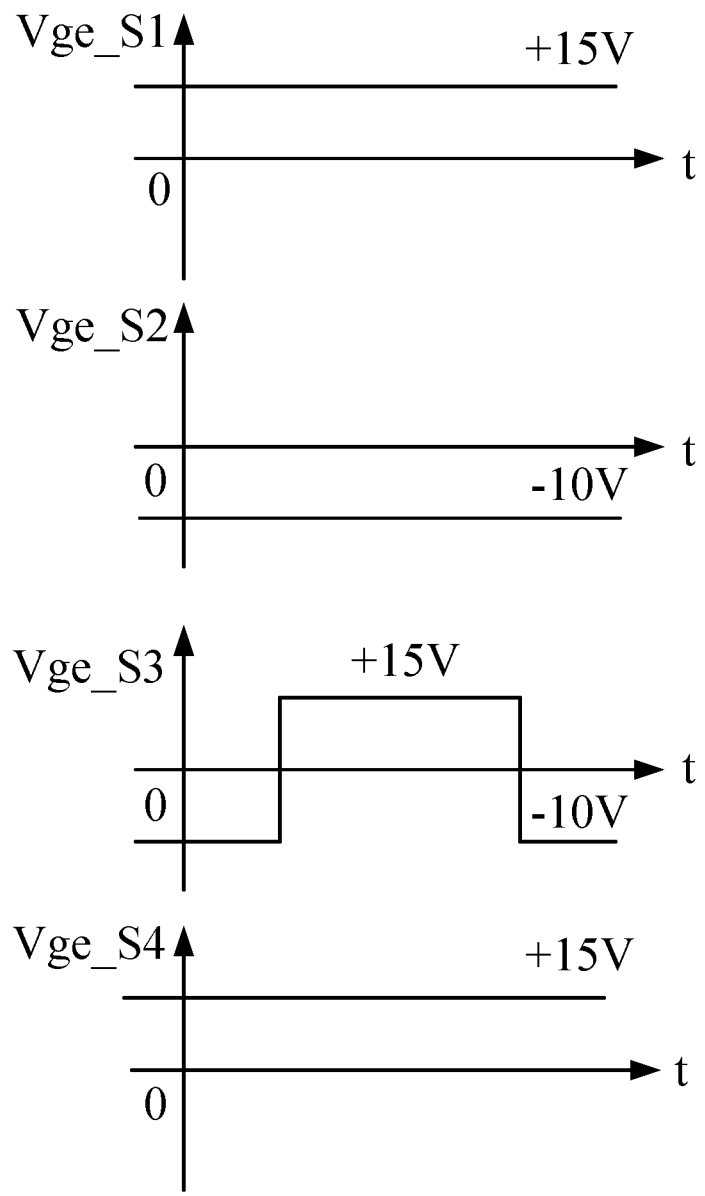
FIG. 2F is a schematic diagram illustrating another waveforms for driving the switches, which lead to the short-circuit path in FIG. 2C.

FIG. 2F is a schematic diagram illustrating another kind of waveforms for driving the switches, which lead to the short-circuit path in FIG. 2C. The waveforms of the driving voltages Vge_S1, Veg_S2, Veg_S3 and Veg_S4 of the switches S1~S4 varying with time are respectively shown in FIG. 2F. Before the switch S3 turns on, the switch S1 turns on due to a wrong driving waveform. When a turning-on signal of the switch S3 is coming, a short current flowing through the positive DC terminal "+", the switch S1, the diode D4, the switch S3, and the midpoint G of the capacitor bridge arm is formed.

Figure 2G:
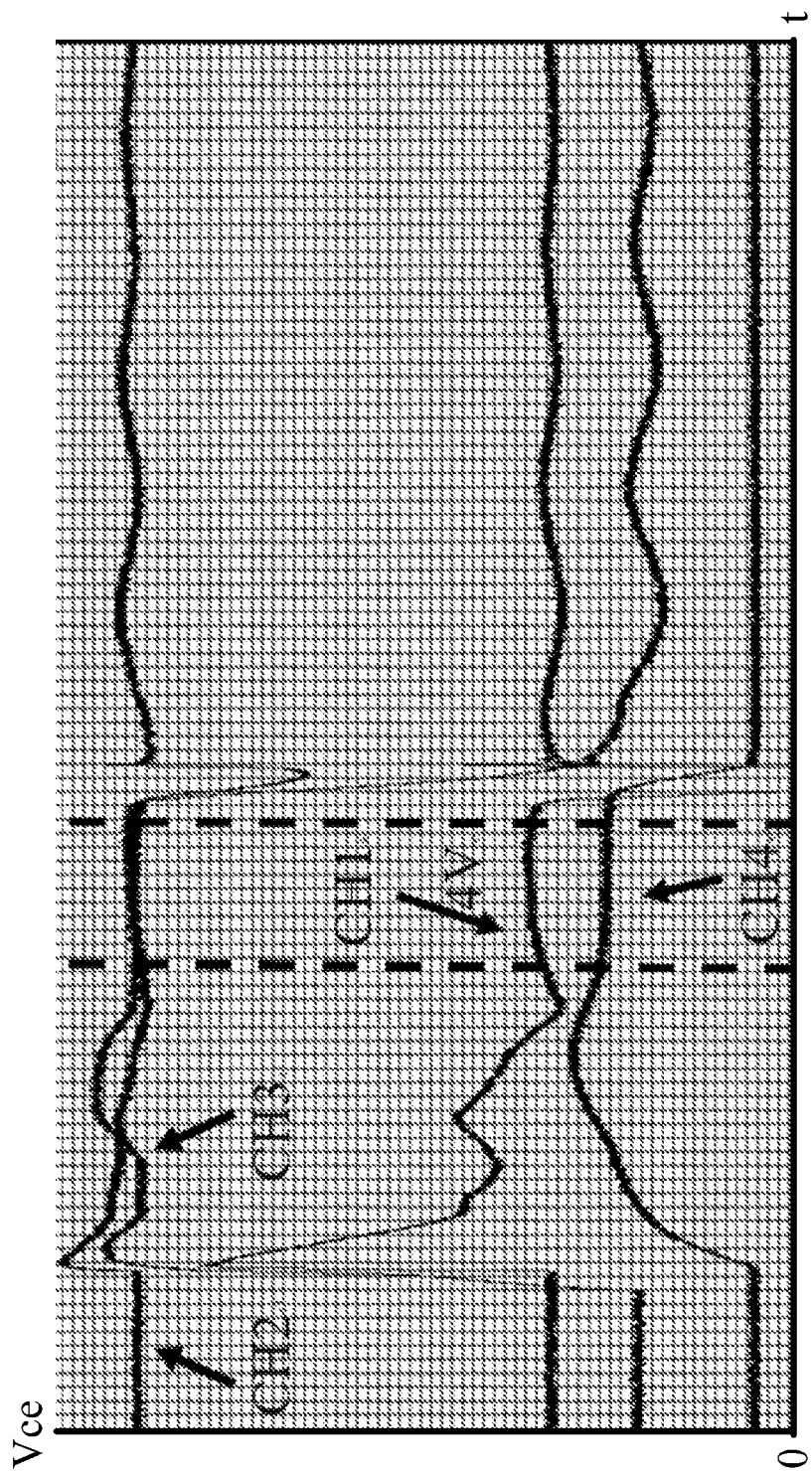
FIG. 2G is a schematic diagram illustrating experiment waveforms corresponding to circumstances of FIGS. 2C and 2F.

FIG. 2G is a schematic diagram illustrating experiment waveforms to perform the operation illustrated in FIGS. 2C and 2F, wherein CH1 is the waveform of the voltage Vce (50V/div) between the collector and the emitter of the switch S1, CH2 is the waveform of the driving voltage Vge_S1 (5V/div) of the switch S1, CH3 is the waveform of the driving voltage Vge_S3 (5V/div) of the switch S3, and CH4 is the waveform of the short current Ic (1 kA/div) of the short-circuit path. As shown in FIG. 2G, during the time of a short-circuit detection shown between two vertical dotted lines, the voltage Vce_S1 between the collector and the emitter of the switch S1 is only about 4V, which is insufficient for, e.g., the aforesaid circuit X1 for detecting Vce de-saturation, to correctly determine whether a short-circuit occurs in the inverter at this time. That is, if the switches S3 and S4 in the bi-directional switching bridge arm are not detected, the method for detecting a short circuit in the TNPC inverter in the related art is still unable to correctly determine whether a short-circuit occurs in the TNPC inverter.

Figure 2H:
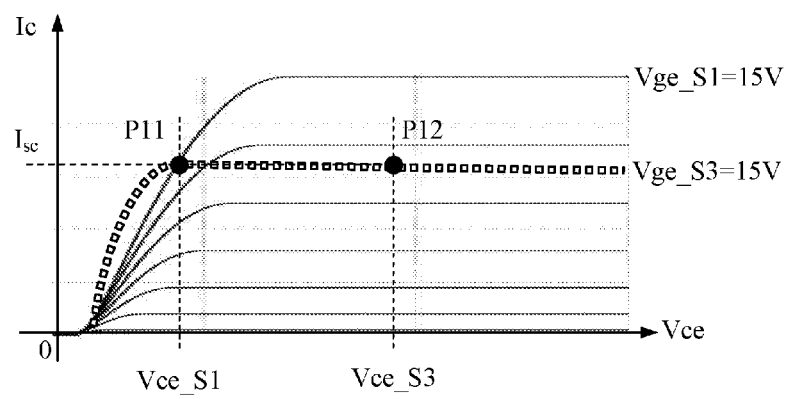
FIG. 2H is a schematic diagram illustrating a defect existing in the method for detecting a short-circuit in a bridge arm of a TNPC inverter in the related art.

The reason for the above issue lies in that rated currents of the switches S1 and S2 in the inverting bridge arm in the standard TNPC inverter module and their anti-parallelly connected diodes D1 and D2 in the conventional art are respectively greater than those of the switches S3 and S4 in the bi-directional switching bridge arm and their anti-parallelly connected diodes D3 and D4. For example, under the condition that the temperature of the case is 25° C., rated currents of the switches S1 and S2 in a TNPC three-level inverter module of a model F3L400R12PT4_B 26 (Infineon) are 600 A, while the rated currents of the switches S3 and S4 are 360 A. In this case, under the two manners of driving waves shown in FIGS. 2D and 2F, in a short-circuit loop formed by the positive DC terminal "+", the switch S1, the diode D4, the switch S3 and the midpoint G of the capacitor bridge arm, the switches S1 and S3 are connected in series, the static short current Isc of the two switches are the same, e.g., 2000 A, and since there is a relatively large difference between the switch rated currents of the used switches S1 and S3, the static short current Isc reaches 4~7 times of the rated current of the switch S3, but does not reach 4~7 times of the rated current of the switch S1. FIG. 2H is a schematic diagram illustrating an issue existing in the method for detecting a short circuit in a bridge arm of a TNPC inverter in the related art. As shown in FIG. 2H, a plurality of solid curves are characteristic curves of the switch S1 with respect to different gate voltages, and a dotted curve formed by grids is a characteristic curve of the switch S3 with respect to a 15V gate voltage (for clearness, only one characteristic curve of the switch S3 is plotted). Based on the characteristic of the switches, under the same level of the driving voltage, for example, both the corresponding driving voltages $Vge_{13}$ S1 and Vge_S3 of the switches S1 and S3 are 15V, the short-circuit detection voltage (i.e., the voltage between the collector and the emitter) Vce_S1 of the switch S1 is relatively small, e.g., the switch S1 operates at an intersection point P11 on both the characteristic curve of the switch S1 with 15V gate voltage and the characteristic curve of the switch S3 with 15V gate voltage, the short-circuit detection voltage Vce_S1 is only 3V or 4V, while the short-circuit detection voltage Vce_S3 of the switch S3 is relatively large, e.g., the switch S3 operates at an operating point P12 on the characteristic curve of the switch S3 with 15V gate voltage, the short-circuit detection voltage Vce_S3 endures most of the BUS voltage. Under such a circumstance, whether a short circuit occurs in the TNPC inverter cannot be determined correctly only by detecting the switch S1.

The key for addressing the issue existing in the method for detecting a short circuit in the TNPC inverter in the conventional technique is how to improve the voltage Vce between the collector and the emitter of the switches S1 and S2 in an inverting bridge arm during the time when a short-circuit occurs, for instance, improve it to be greater than 5.6V.

Figure 3A:
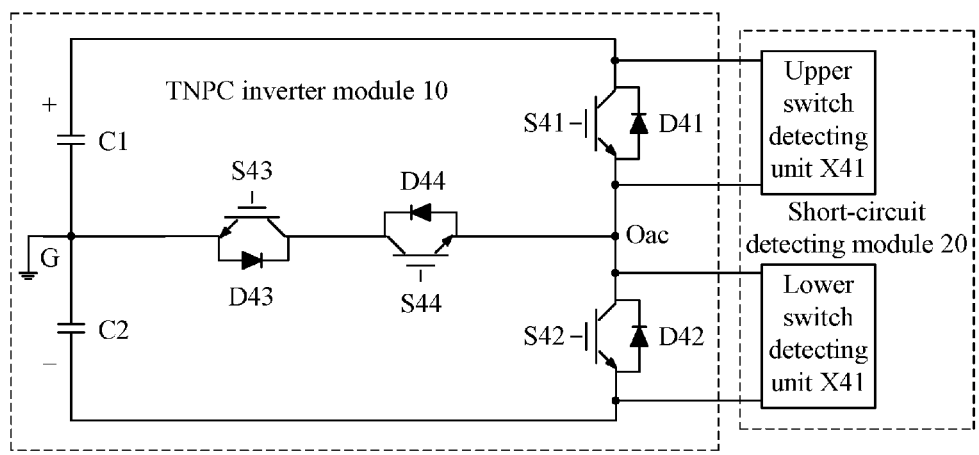
FIG. 3A is a schematic diagram illustrating a block diagram of an embodiment of the TNPC inverter device of the present application.

For the above purpose, the applicant proposes a new TNPC inverter device. FIG. 3A is a schematic diagram illustrating a block diagram of an embodiment of the TNPC inverter device of the present application. FIG. 3A is an improvement based on FIG. 1G, and the same or similar components or elements are not repeated here. As shown in FIG. 3A, the TNPC inverter device of this embodiment includes: a TNPC inverter module 10 including a first DC terminal "+", a second DC terminal "−", an AC terminal Oac, a capacitor bridge arm, an inverting bridge arm and a bi-directional switching bridge arm, wherein ends of the inverting bridge arm are correspondingly connected to the first DC terminal "+" and the second DC terminal "−", ends of the bi-directional switching bridge arm are correspondingly connected to a midpoint G of the capacitor bridge arm and the AC terminal Oac of the inverting bridge arm, wherein the AC terminal Oac is a midpoint Oac of the inverting bridge arm, the inverting bridge arm includes an upper switch unit S41 and a lower switch unit S42; and a short-circuit detecting module 20 mainly consists of an upper switch detecting unit X41 and a lower switch detecting unit X42, wherein the upper switch detecting unit X41 is configured to detect a voltage drop of the upper switch unit S41, and the lower switch detecting unit X42 is configured to detect a voltage drop of the lower switch unit S42.

As an embodiment, the TNPC inverter module shown in FIG. 3A may further include one midpoint terminal (not shown) which is electrically connected to the midpoint G of the capacitor bridge arm.

As an embodiment, in the TNPC inverter module shown in FIG. 3A, the bi-directional switching bridge arm includes a first flow direction switch unit S43 and a second flow direction switch unit S44. When the first flow direction switch unit S43 turns on, the current in the bi-directional switching bridge arm flows from the AC terminal to the midpoint terminal, and when the second flow direction switch unit S44 turns on, the current in the bi-directional switching bridge arm flows from the midpoint terminal to the AC terminal.

The TNPC inverter module shown in FIG. 3A is illustrated by referring to a conventional TNPC inverter module.

The TNPC inverter module shown in FIG. 3A includes four switches (i.e., switch units) S41~S44. The four switches are plastically encapsulated in one packing case having pins for the connection terminals of the four switches. Due to the working manner of the TNPC inverter module per se, the parameters of the switches S41 and S42 are generally different from the parameters of the switches S43 and S44 in the bi-directional switching bridge arm. In a conventional TNPC inverter module, the rated voltage and rated currents of the switches S41 and S42 are higher than those of the switches S43 and S44. Thereby, when a short-circuit path is formed by a loop of the first DC terminal "+" or the second DC terminal "−" and the bi-directional switching bridge arm, it can not be detected only by an upper switch detection unit X41 and/or a lower switch detection unit X42. In order to detect such a short-circuit circumstance, it is needed that a voltage drop of the upper switch S41 or the lower switch S42 in the short-circuit path is not less than a voltage drop of the corresponding first flow direction switch unit S43 or second flow direction switch unit S44.

In order to achieve that the short-circuit detection module 20 mainly consisting of the upper switch detection unit X41 and the lower switch detection unit X42 can detect any a short-circuit path in the TNPC inverter module, implementing manners are illustrated as follows.

In the first embodiment, the static driving voltage of the upper switch unit S41 and the lower switch unit S42 is reduced without changing the parameters of respective switches in a conventional TNPC inverter module. In the customary TNPC inverter module in the conventional technology, e.g., the TNPC inverter module shown in FIG. 3A, the static driving voltages of the four switch units (i.e., switches) S41~S44, corresponding to their switch parameters, are the same driving voltage. The same driving voltage may simplify the manufacture of the driving circuits of the respective switches. However, in order to detect a short-circuit in any circumstances in a conventional TNPC module only by the upper switch detection unit X41 and the lower switch detection unit X42, the present application adjusts the driving circuits of the upper switch S41 and the lower switch S42, such that the static driving voltage of any one of the upper switch S41 and the lower switch S42 is less than the static driving voltage of any one of the first flow direction switch S43 and the second flow direction switch S44. By reducing the driving voltages of the upper switch S41 and the lower switch S42, the voltages between the collectors and the emitters of the upper switch S41 and the lower switch S42 are increased when any a short-circuit path occurs, such that the short-circuit detection module 20 can detect the short-circuit circumstance.

Figure 3B:
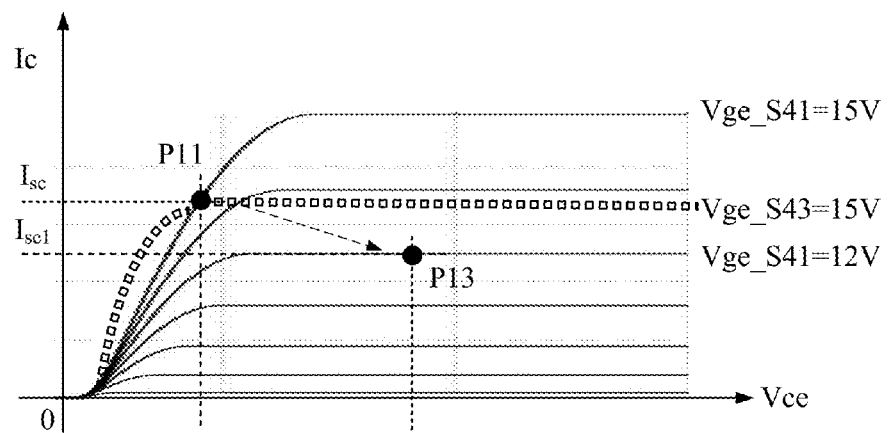
FIG. 3B is a schematic diagram illustrating an embodiment of a means for improving the effect of detecting occurrence of short-circuit in one embodiment of TNPC inverter device of the present application.

The increase of the voltage between the collector and the emitter of the upper switch S41 achieved by reducing the driving voltage of the upper switch S41 is illustrated by FIG. 3B. As shown in FIG. 3B, a plurality of solid curves are characteristic curves of the switch S41 with respect to different gate voltages, and a dotted curve formed by grids is characteristic curve of the switch S43 with respect to a 15V gate voltage (for clearness, only one characteristic curve of the switch S43 is plotted). Assuming that the switches S41 and S43 still have the characteristic curves of the corresponding switches S1 and S3 shown in FIG. 2H, and the rated current of the switch S41 is greater than that of the switch S43. By reducing the static driving voltage Vge_S41 of the switch S41, for example, reducing the static driving voltage Vge_S41 from 15V to 12V, and keeping the static driving voltage Vge_S43 of the switch S43 unchanged, the voltage Vce between the collector and the emitter of the switch S41, during the time when a short-circuit occurs, moves from the point P11 in FIG. 2H to the point P13 in FIG. 3B. In this way, the identification criterion of the static short current Isc is reduced, such that the voltage Vce between the collector and the emitter of the switch S41 increases. Thereby, the upper switch detecting unit X41 in FIG. 3A can detect the occurrence of a short-circuit reliably.

Figure 3C:
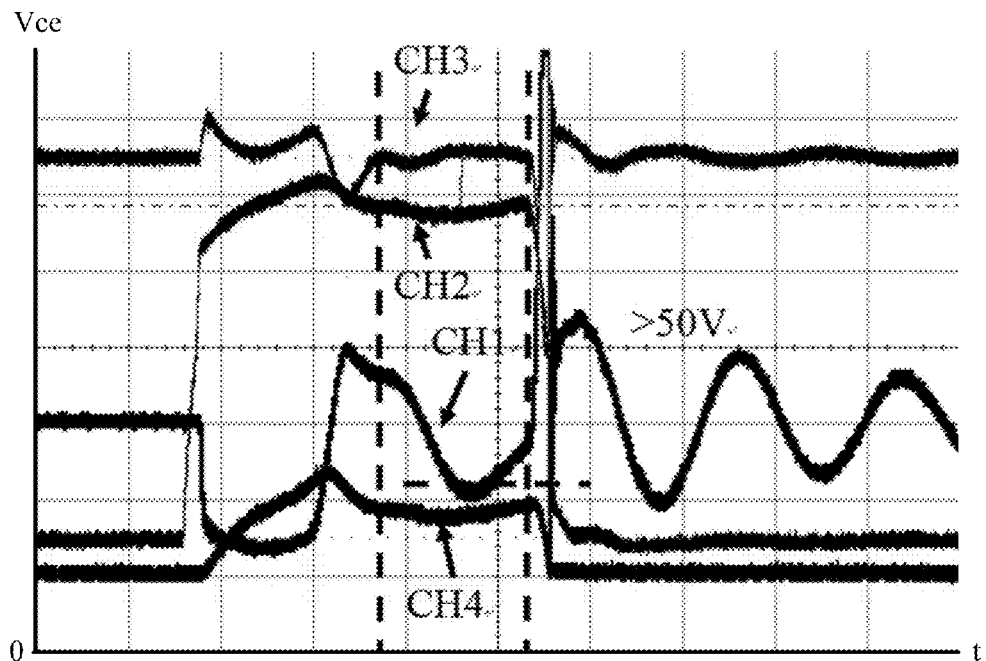
FIG. 3C is a schematic diagram illustrating the effect of detecting a straight-through short-circuit in the bridge arm corresponding to circumstances in FIGS. 3A and 3B.

FIG. 3C is a schematic diagram illustrating the effect of detecting a short-circuit in the TNPC inverter performed the method illustrated in FIGS. 3A and 3B, wherein the manners of triggering a short circuit shown in FIG. 2D are adopted, CH1 is the waveform of the voltage Vce (50V/div) between the collector and the emitter of the switch S41, CH2 is the waveform of the driving voltage Vge_S41 (5V/div) of the switch S41, CH3 is the waveform of the driving voltage Vge_S43 (5V/div) of the switch S43, and CH4 is the experiment waveform of the short current Ic (1 kA/div) of the short-circuit path. The voltage Vce between the collector and the emitter of the switch S41 is greater than 50V, such that the upper switch detecting unit X41 in FIG. 3A can detect the occurrence of a short-circuit reliably.

The TNPC inverter device may further include a driving voltage generating circuit. FIGS. 5A~5D illustrate examples of the driving voltage generating circuit with respect to the TNPC inverter device shown in FIG. 3A.

Figure 5A:
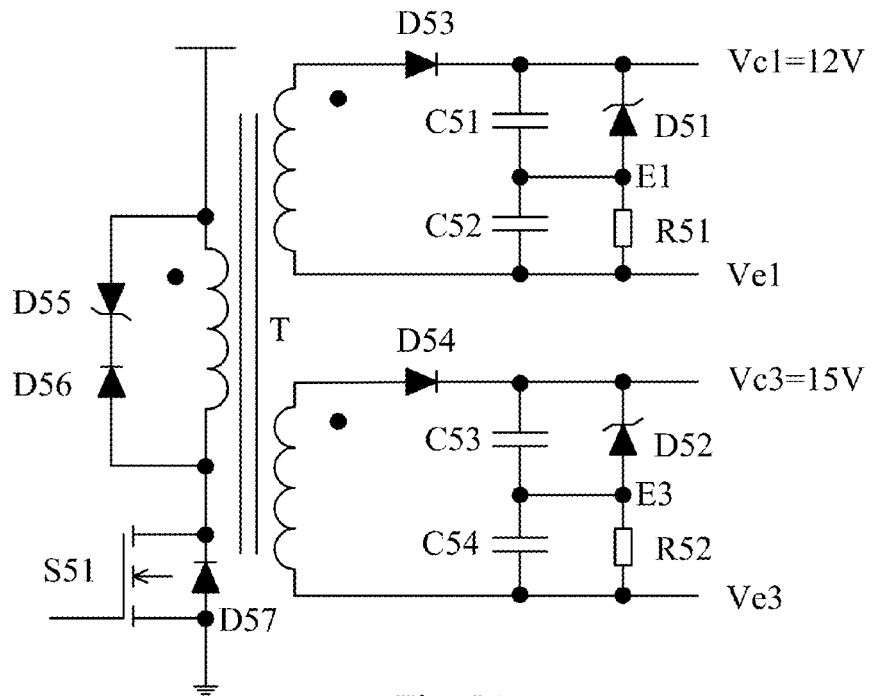
FIG. 5A is a schematic diagram illustrating an embodiment of a driving voltage generating circuit of the TNPC inverter device of the present application.

As shown in FIG. 5A, the driving voltage generating circuit includes a driving voltage generating circuit for driving the upper switch S41 (upper right in the drawing), which includes a stabilivolt D51. The driving voltage generating circuit further includes a driving voltage generating circuit for driving the first flow direction switch S43 (lower right in the drawing), which includes a stabilivolt D52. In conventional applications of the TNPC inverter module, the static driving voltages for driving the upper switch S41 and for driving the first flow direction switch S43 are substantially the same. However, in the embodiments illustrated in the present disclosure, in order to enable the upper switch detection unit X41 corresponding to the upper switch S41 to detect the occurrence of the short-circuit comprised the upper switch S41, the static driving voltage of the upper switch S41 needs to be reduced to make the static driving voltage of the upper switch S41 to be less than the static driving voltage of the first flow direction switch S43. As shown in FIG. 5A, the voltage of the stabilivolt D51 is selected to be less than the voltage of the stabilivolt D52, for example, the operating voltage of the stabilivolt D51 is 12V and the operating voltage of the stabilivolt D52 is 15V, such that the static driving voltage Vge_S41 generated by the driving voltage generating circuit for driving the upper switch S41 is Vge_S41=Vc1=12V, and the static driving voltage Vge_S43 generated by the driving voltage generating circuit for driving the upper switch S43 is Vge_S43=Vc3=15V. Additionally, auxiliary components such as diodes D53, D54, D56 and D57, a stabilivolt D55, a switch S51, a transformer T, capacitors C51, C52, C53 and C54, resistors R51 and R52, and output lines such as nodes E1 and E3, and connection terminals Vc1, Ve1, Vc3 and Ve3, are further included in FIG. 5A, and the connection relationships among them are as shown in FIG. 5A, which are not repeated here.

Figure 5B:
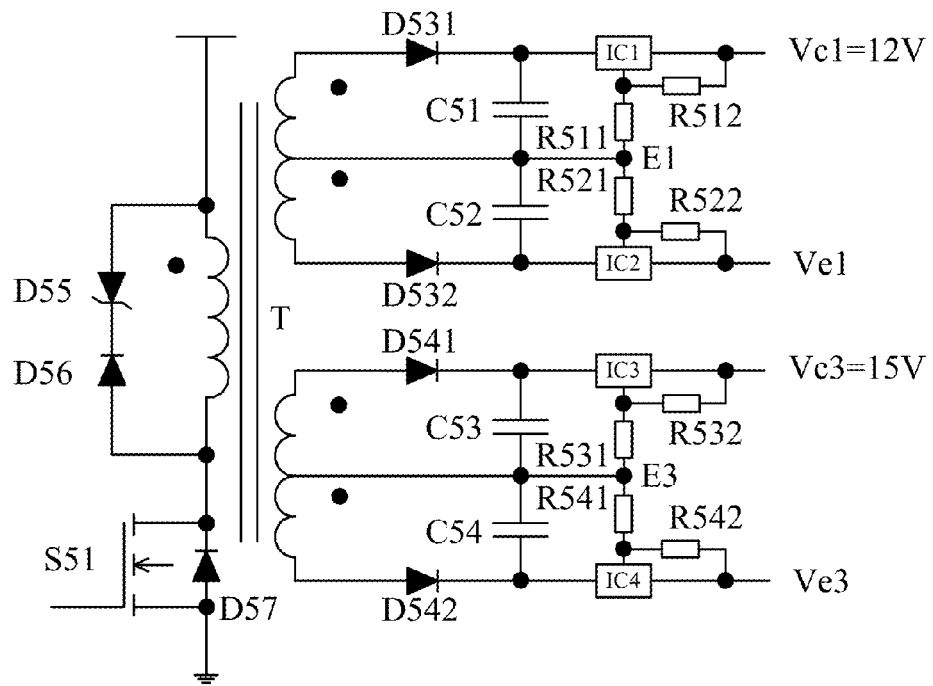
FIG. 5B is a schematic diagram illustrating another embodiment of a driving voltage generating circuit of the TNPC inverter device of the present application.

As shown in FIG. 5B, the static driving voltage of the upper switch S41 being less than the static driving voltage of the first flow direction switch S43 may also be, for example, achieved by adjusting voltage adjusting resistors in the driving voltage generating circuit. For example, the driving voltage generating circuit for driving the upper switch S41 includes voltage stabilizing integrated circuits IC1 and IC2, and voltage adjusting resistors R512 and R522. The driving voltage generating circuit for driving the first flow direction switch S43 includes voltage stabilizing integrated circuits IC3 and IC4, and voltage adjusting resistors R532 and R542. By adjusting the resistances of the voltage adjusting resistors R512 and R522 and adjusting the resistances of the voltage adjusting resistors R532 and R542, it may be achieved that the static driving voltage of the upper switch S41 is less than the static driving voltage of the first flow direction switch S43. For example, by adjusting the voltage stabilizing integrated circuits IC1 and IC2 through the voltage adjusting resistors R512 and R522, and adjusting the voltage stabilizing integrated circuits IC3 and IC4 through the voltage adjusting resistors R532 and R542, the static driving voltage Vge_S41 generated by the driving voltage generating circuit for driving the upper switch S41 is Vge_S41=Vc1=12V, and the static driving voltage Vge_S43 generated by the driving voltage generating circuit for driving the upper switch S43 is Vge_S43=Vc3=15V. Additionally, auxiliary components such as diodes D531, D532, D541, D542, D56 and D57, a stabilivolt D55, a switch S51, a transformer T, capacitors C51, C52, C53 and C54, resistors R511, R521, R531 and R541, and output lines such as nodes E1 and E3, and connection terminals Vc1, Ve1, Vc3 and Ve3, are further included in FIG. 5, and the connection relationships among them are as shown in FIG. 5B, which are not repeated here.

Since the configuration of the lower switch unit S42 and the second flow direction switch S44 is electrically symmetric with the configuration of the upper switch S41 and the first flow direction switch S43, the static driving voltage for driving the lower switch S42 being less than the static driving voltage for driving the second flow direction switch S44 may be achieved with reference to FIG. 5A or 5B. For the person skilled in the art, it can be understand that the driving voltage generating circuit may not be only formed by stabilivolts, or voltage stabilizing integrated circuits and voltage adjusting resistors, but also may be in other forms, or various combinations. The output of different static driving voltages may be achieved by adjusting parameters of corresponding components in the driving voltage generating circuit.

Figure 5C:
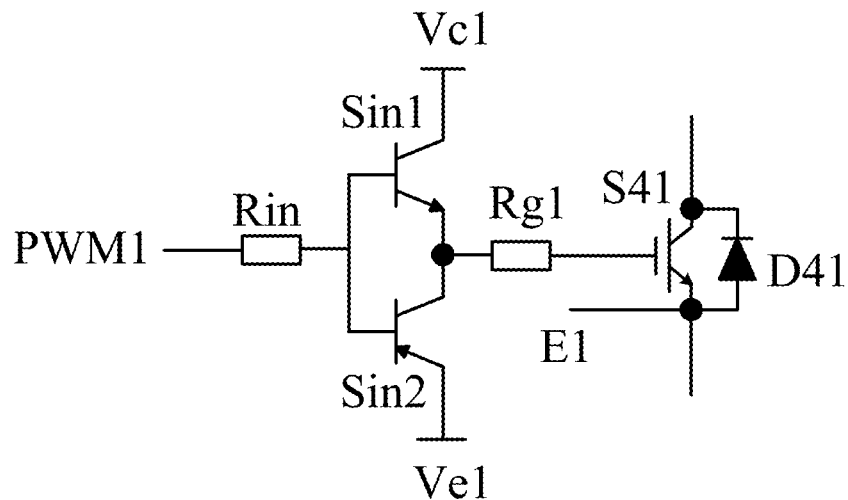
FIG. 5C is a schematic diagram illustrating further another embodiment of a driving voltage generating circuit of the TNPC inverter device of the present application.
Figure 5D:
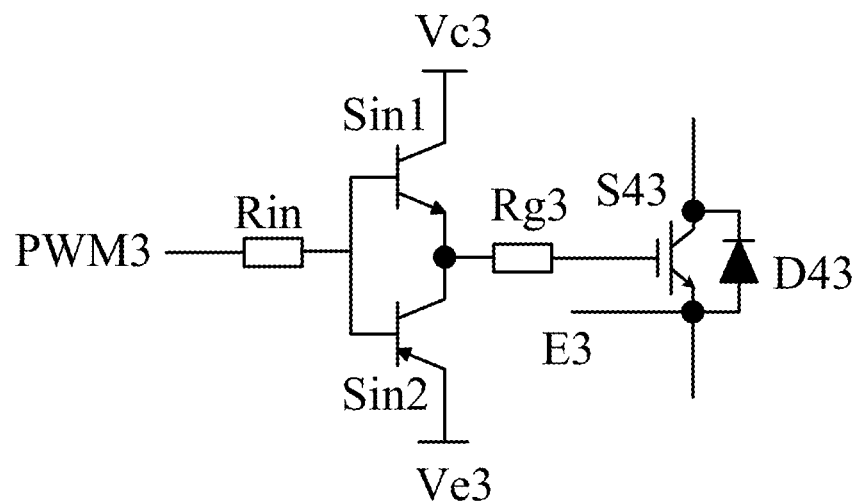
FIG. 5D is a schematic diagram illustrating still another embodiment of a driving voltage generating circuit of the TNPC inverter device of the present application.

Although the total loss of a switch may be increased when the static driving voltage is reduced to be less than a normal driving voltage of the switch, the switching loss may be kept unchanged by adjusting the driving resistor to which the switch corresponds, then the increase of the conductive loss may be ignored. As shown in FIG. 5C, the driving voltage generating circuit for driving the upper switch S41 further includes a connection resistor Rg1, and when the static driving voltage of the upper switch S41 is reduced, the switching loss of the upper switch S41 may be reduced by decreasing the resistance of the connection resistor Rg1. FIG. 5D is a schematic diagram illustrating that the driving voltage generating circuit for driving the first flow direction switch S43 drives the first flow direction switch S43 via a connection resistor Rg3, and the resistance of the connection resistor Rg3 may not be decreased. In FIGS. 5C and 5D, the driving voltage generating circuit push-pull outputs via geminate switches Sin1 and Sin2, pulse-width modulation signals PWM1 and PWM2 input via a resistor Rin, the upper switch S41 and the first flow direction switch S43 are respectively anti-parallelly connected with diodes D41 and D43, nodes E1 and E3 shown in FIG. 5A are for example connected to nodes E1 and E3 shown in FIGS. 5C and 5D, connection terminals Vc1, Ve1, Vc3 and Ve3 are the same as those in FIGS. 5A and 5B, and the connection relationships among them are shown in FIGS. 5C and 5D, which are not repeated here. For the lower switch S42, the same device or method may be adopted to reduce the switching loss, which is not repeated here.

In the second embodiment, still by refer to the configuration of the TNPC inverter module shown in FIG. 3A, it is illustrated that, if the application environment of the TNPC inverter module is allowable, the parameters of the upper switch S41 and the lower switch S42 may be selected to be the same as or similar to those of the first flow direction switch S43 and the second flow direction switch S44, thereby, the rated current of any one of the upper switch S41 and the lower switch S42 may not be greater than the rated current of any one of the first flow direction switch S43 and the second flow direction switch S44.

Figure 3D:
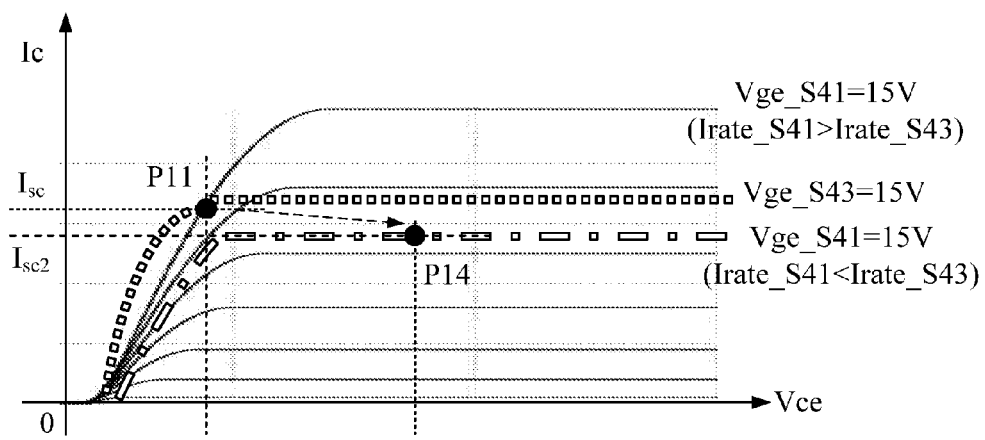
FIG. 3D is a schematic diagram illustrating another embodiment of a means for improving the effect of detecting a straight-through short-circuit in the bridge arm in the TNPC inverter device of the present application.

Hereafter, the second embodiment is explained in detail by referring to FIG. 3D. As shown in FIG. 3D, a plurality of solid curves are characteristic curves of the switch S41 with respect to different gate voltages, a dotted curve formed by grids is a characteristic curve of the switch S43 with respect to a 15V gate voltage (for clearness, only one characteristic curve of the switch S43 is plotted), a chain dotted curve formed by grids is another characteristic curve of the switch S41 with 15V gate voltage under a circumstance that the rated current Irate_S41 of the switch S41 is less than the rated current Irate_S43 of the switch S43 (for clearness, only one characteristic curve of the switch S41 is plotted). Assuming that the static driving voltages of the switches S41 and S43 are the same, for example, the static driving voltage Vge_S41 of the switch S41 and the static driving voltage Vge_S43 of the switch S43 are kept to be 15V, then, by selecting parameters of the switches per se, the rated current Irate_S41 of the switch S41 decreases or the rated current Irate_S43 of the switch S43 increases, such that the rated current of the switch S41 is less than the rated current Irate_S43 of the switch S43. In the present embodiment, by choosing the smaller rated current Irate_S41 of the switch S41, the voltage Vce between the collector and the emitter of the switch S41 during the time when a short-circuit occurs, operates at point P14 not point P11 in FIG. 3D, wherein the operating point P11 is, for example, an intersection point on both the characteristic curve of the switch S41 with normal rated current driving with 15V gate voltage, and the characteristic curve of the switch S43 with smaller rated current compared with the rated current of the switch S41 and driving with 15V gate voltage, and the operating point P14 is an operating point on the characteristic curve of the switch S41 with smaller rated current driving with 15V gate voltage. In the present embodiment, by selecting the parameters of the switches per se, the identification criterion of the static short current Isc is reduced, such that a voltage Vce between the collector and the emitter of the switch S41 increases, meanwhile a voltage Vce between the collector and the emitter of the switch S43 does not increase, such that the bus voltage is mainly endured by the switch S41, and such that the upper switch detecting unit X41 in FIG. 3A can detect the occurrence of a short circuit in the TNPC inverter sufficiently and reliably.

In the third embodiment, in the TNPC inverter module shown in FIG. 3A, a transconductance of the upper switch S41 or the lower switch S42 is less than a transconductance of the first flow direction switch S43 or the second flow direction switch S44. In this way, the purpose for increasing the voltage Vce between the collectors and the emitters of the switch units S41 or S42 during a short circuit may be achieved.

The short circuit path in the inverter shown in FIG. 2A is symmetric with that shown in FIG. 2C, thereby the above-mentioned solution may also be used to increase the voltage Vce between the collector and the emitter of the switch S2 (i.e., corresponding to the switch unit S42 in FIG. 3A), so as to detect the occurrence of a short circuit. Therefore, detecting other short-circuit circumstances in TNPC by detecting the lower switch S42 through the lower switch detecting unit X42 are not repeated here.

The short-circuit path shown in FIG. 2B only passes through the switches S1 and S2 (i.e., corresponding to the switches unit S41 and S42 in FIG. 3A), but does not pass through the switches S3 and S4, which can be exactly detected by the upper switch detecting unit and the lower switch detecting unit, thereby will not be repeated here.

Thereby, the above description is illustrated by taking the TNPC inverter module shown in FIG. 3A as an example, in which the short circuit detecting module mainly consisting of the upper switch detecting unit and the lower switch unit may achieve the detection of various paths of short circuit in the TNPC inverter modules. Compared with the conventional technology, this kind of TNPC inverter module may efficiently reduce the number of switch detecting units used in the short circuit detecting module, and reduce the probability of false operation due to external interference to the switch detecting unit.

Although the above embodiments are all illustrated by taking the TNPC inverter module shown in FIG. 3A as an example, the upper switch unit is not limited to the upper switch S41, and the lower switch unit is not limited to the lower switch S42. Similarly, the first flow direction switch unit is not limited to the first flow direction switch S43 shown in FIG. 3A, and the second flow direction switch unit is not limited to the second flow direction switch S44 shown in FIG. 3A.

Figure 4A:
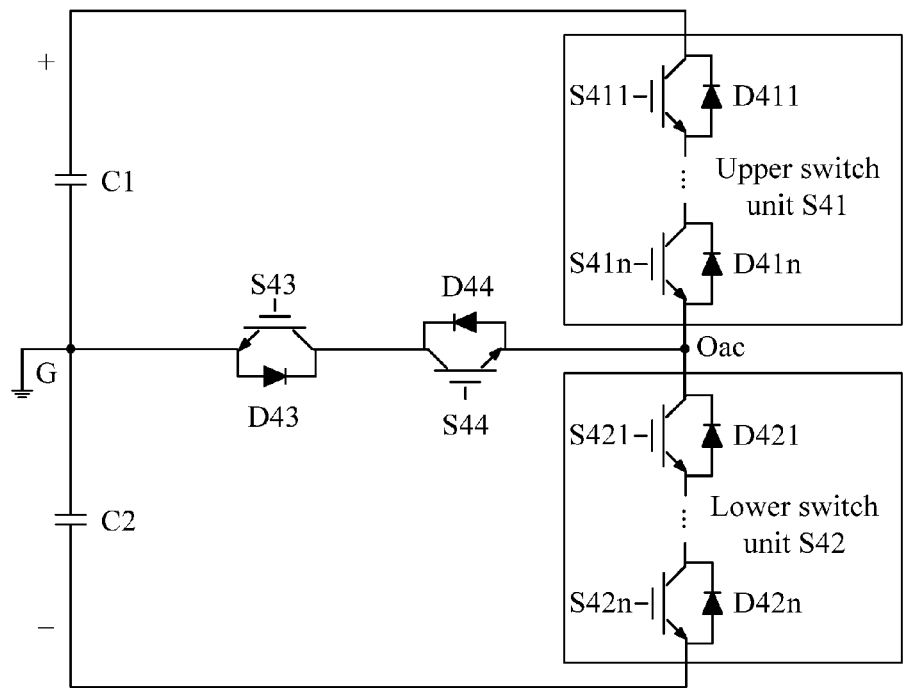
FIG. 4A is a schematic diagram illustrating an embodiment of an extended topology of the TNPC inverter device of the present application.
Figure 4B:
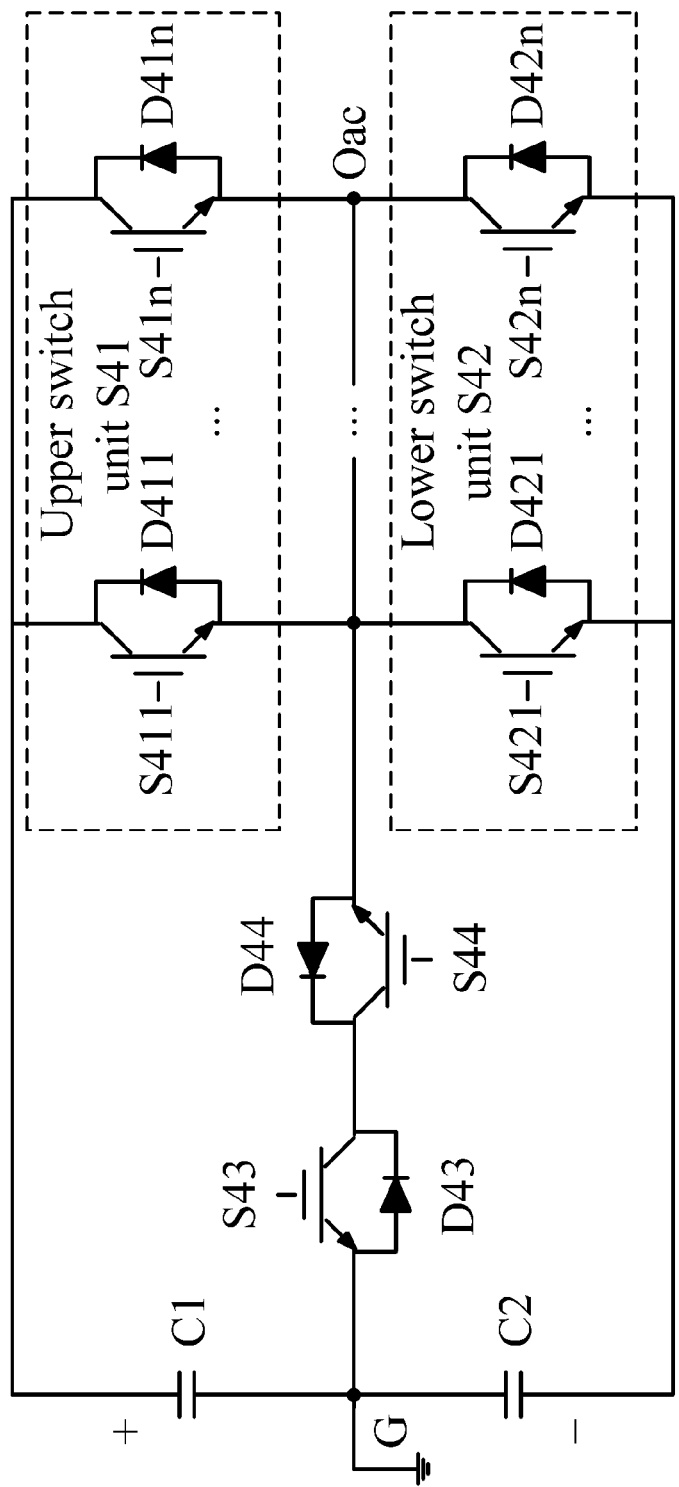
FIG. 4B is a schematic diagram illustrating another embodiment of an extended topology of the TNPC inverter device of the present application.
Figure 4C:
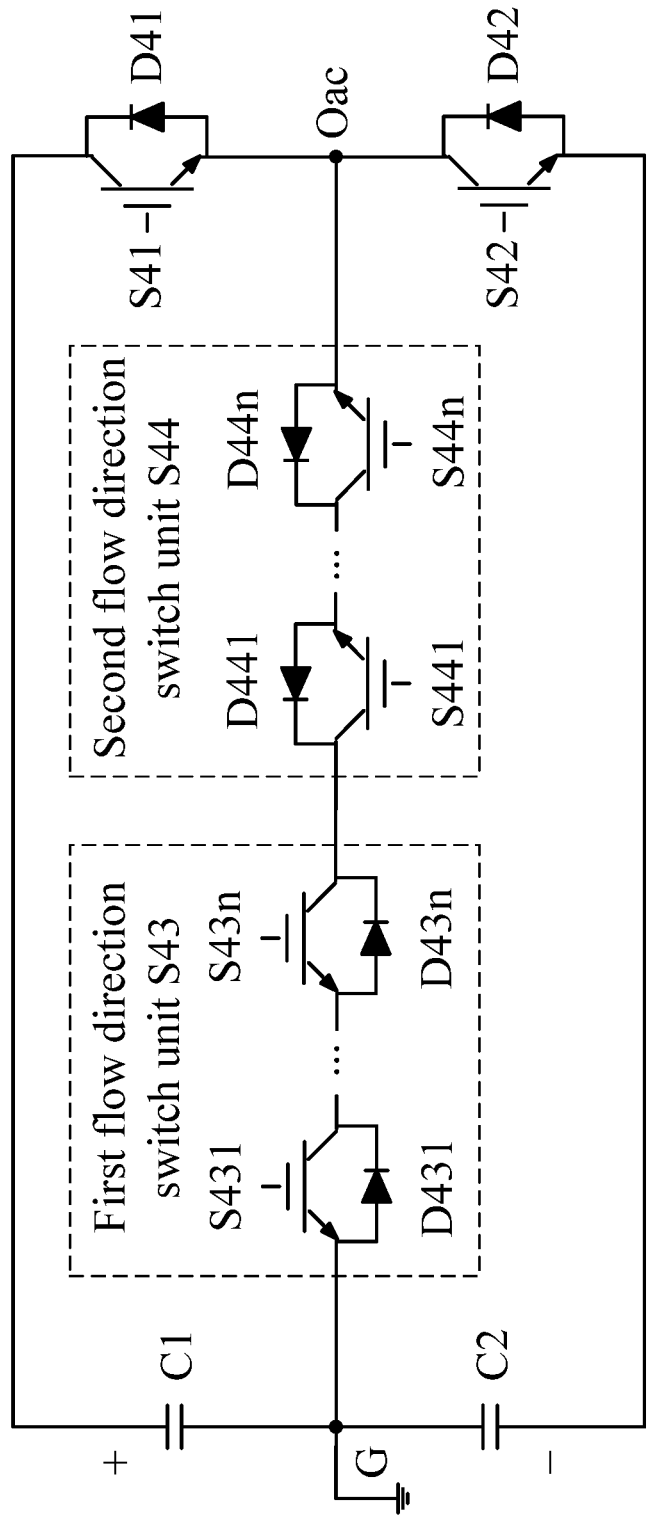
FIG. 4C is a schematic diagram illustrating further another embodiment of an extended topology of the TNPC inverter device of the present application.
Figure 4D:
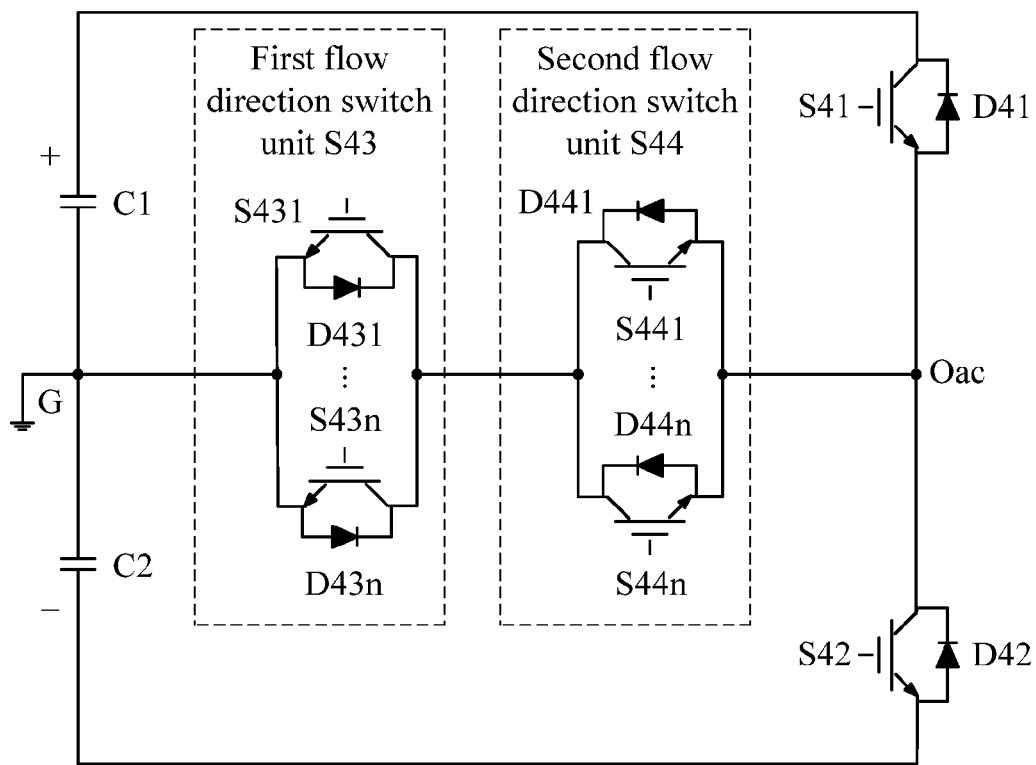
FIG. 4D is a schematic diagram illustrating still another embodiment of an extended topology of the TNPC inverter device of the present application.
Figure 4E:
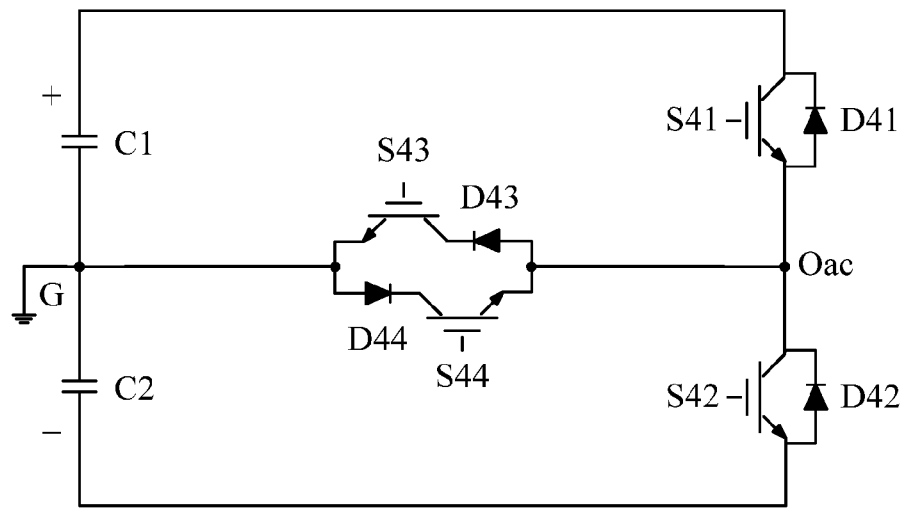
FIG. 4E is a schematic diagram illustrating an embodiment of a varied topology of the TNPC inverter device of the present application.

FIG. 4A is a schematic diagram illustrating an embodiment of an extended topology of the TNPC inverter device of the present application. As shown in FIG. 4A, the upper switch unit is formed of a plurality of switches S411, . . . and S41n connected in series, and the lower switch unit is formed of a plurality of switches S421, . . . and S42n connected in series. Such configuration of the upper and lower switch units is used for improving the operating voltage of the TNPC inverter module. FIG. 4B is a schematic diagram illustrating another embodiment of an extended topology of the TNPC inverter device of the present application. As shown in FIG. 4B, the upper switch unit may be formed of a plurality of switches S411, . . . and S41n connected in parallel, and the lower switch unit may be formed of a plurality of switches S421, . . . and S42n connected in parallel, so as to improve the operating current of the TNPC inverter module. FIG. 4C is a schematic diagram illustrating further another embodiment of an extended topology of the TNPC inverter device of the present application. The first flow direction switch unit may be formed of a plurality of switches S431, . . . and S43n connected in series, and the second flow direction switch unit may be formed of a plurality of switches S441, . . . and S44n connected in series, so as to improve the operating voltage of the TNPC inverter module. FIG. 4D is a schematic diagram illustrating still another embodiment of an extended topology of the TNPC inverter device of the present application. As shown in FIG. 4D, the first flow direction switch unit may be formed of a plurality of switches S431, . . . and S43n connected in parallel, and the second flow direction switch unit may be formed of a plurality of switches S441, . . . and S44n connected in parallel, so as to improve the operating current of the TNPC inverter module. FIG. 4E is a schematic diagram illustrating an embodiment of a varied topology of the TNPC inverter device of the present application. As shown in FIG. 4E, the first flow direction switch unit and the second flow direction switch unit are connected in parallel, each of the switches constituting the first flow direction switch unit or the second flow direction switch unit is connected with a diode in reverse series, such as diodes D43 and D44, and each of the switches constituting the upper switch unit or the lower switch unit is anti-parallelly connected with a diode.

As an embodiment, in the TNPC inverter modules shown in FIGS. 3A~4E, any switch in the upper switch unit and the lower switch unit is anti-parallelly connected with a diode, such as diodes D41, D42, D441, . . . and D41n, D421, . . . and D42n.

It should be definitely pointed out that, in the TNPC inverter modules shown in FIGS. 3A~4E, all the switches are the controllable switches. The controllable switches include Insulated Gate Bipolar Transistor (IGBT), Metal-Oxide-Semiconductor Field-Effect Transistor (MOSFET), Bipolar Junction Transistor (BJT), Junction Field-Effect Transistor (JFET), Gate Turn-Off Thyristor (GTO) or Metal-Oxide-Semiconductor Control Transistor (MCT).

Taking a TNPC inverter module according to the present application as an example, for those of a TNPC three-level inverter module of a model F3L400R12PT4_B 26 (Infineon), in order to enable the short circuit detecting module to detect the short circuit in any path in the TNPC inverter module according to the present application, voltage drop of any one of the upper switch and the lower switch thereof when a short-circuit path is formed is greater than 5.6V.

Figure 6:
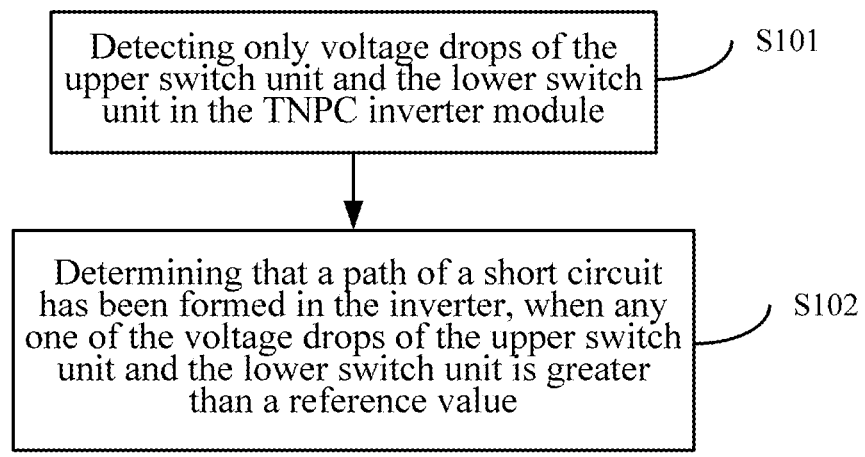
FIG. 6 is a schematic diagram illustrating a flow chart of a method for detecting a straight-through short-circuit in a bridge arm of a TNPC inverter of the present application.

Another aspect of the present disclosure provides a method for detecting a short circuit in a TNPC inverter device. FIG. 6 is a schematic diagram illustrating a flow chart of the method for detecting a short circuit in a TNPC inverter device.

The method for detecting occurrence of a short circuit in the TNPC inverter device which includes: a TNPC inverter module including a first DC terminal, a second DC terminal, an AC terminal, a capacitor bridge arm, an inverting bridge arm and a bi-directional switching bridge arm, wherein ends of the capacitor bridge arm and ends of the inverting bridge arm are correspondingly connected to the first DC terminal and the second DC terminal, ends of the bi-directional switching bridge arm are correspondingly connected to a midpoint of the capacitor bridge arm and a midpoint of the inverting bridge arm, the AC terminal is the midpoint of the inverting bridge arm, and the inverting bridge arm includes an upper switch unit and a lower switch unit. The TNPC inverter device further includes a short circuit detecting module mainly consisting of an upper switch detecting unit and a lower switch detecting unit, wherein the upper switch detecting unit is configured to detect a voltage drop of the upper switch unit, and the lower switch detecting unit is configured to detect a voltage drop of the lower switch unit. The method for detecting a short circuit in the TNPC inverter device is illustrated in details in FIG. 6, and the method for detecting a short-circuit includes the following steps.

In step S101, only voltage drops of the upper switch unit and the lower switch unit in the TNPC inverter module are detected.

In step S102, when any one of the voltage drops of the upper switch unit and the lower switch unit is greater than a reference value, it is determined that a path of a short circuit has been formed in the inverter.

The detecting method may be applied to the above embodiments of various TNPC inverter module configurations, which are not repeated here. In order to enable the short circuit detecting module to monitor various short-circuit circumstances in the TNPC inverter module, the methods for improving the voltage drop of the upper switch unit and the lower switch unit in the TNPC inverter module detected by the short circuit detecting module when a short-circuit occurs in the upper switch unit or the lower switch unit, which are not repeated here. For those skilled in the art, the TNPC inverter module may also be applied for rectification in other circumstances, which is not limited to the inverting function as limited by the name here.

The present application performs a priority-ranked desaturation to the switches in the inverting bridge arms of the TNPC inverter device, so that the voltage Vce between the collector and the emitter of the switch in the inverting bridge arm of the TNPC inverter device is increased, thereby only by detecting the voltage Vce between the collector and the emitter of the switch in the inverting bridge arm of the TNPC inverter device, the short-circuit in the TNPC inverter device may be detected reliably. Furthermore, since in the present disclosure, only the voltage Vce between the collector and the emitter of the switch in the inverting bridge arm of the TNPC inverter device is detected, the number of the detecting circuits is reduced, and thus the circuit is simple.

Although the present application has been described with reference to the typical embodiments, it should be understood that the terms used here are illustrative and exemplary, not restrictive. Since the present application may be embodied in many forms, it should be appreciated that the above embodiments are not limited to any details mentioned above, but should be interpreted widely within the scope defined by the accompanying claims. Therefore, all the variations and modifications made in the claims or its equivalent scope should be covered by the accompanying claims.

What is claimed is:

1. A TNPC inverter device, comprising:
    a TNPC inverter module comprising:
        a first DC terminal;
        a second DC terminal;
        an AC terminal;
        a capacitor bridge arm;
        an inverting bridge arm comprised an upper switch unit and a lower switch unit which are connected in series; and
        a bi-directional switching bridge arm; and
    a short circuit detecting module, mainly consisting of an upper switch detecting unit and a lower switch detecting unit;
    wherein ends of the capacitor bridge arm and ends of the inverting bridge arm are correspondingly connected to the first DC terminal and the second DC terminal, ends of the bi-directional switching bridge arm are correspondingly connected to a midpoint of the capacitor bridge arm and a midpoint of the inverting bridge arm, the AC terminal is the midpoint of the inverting bridge arm; and
    wherein the upper switch detecting unit is configured to detect a voltage drop of the upper switch unit, and the lower switch detecting unit is configured to detect a voltage drop of the lower switch unit,
    wherein the TNPC inverter module futher comprises a midpoint terminal, and the midpoint of the capacitor bridge arm is eletrically connected with the midpoint terminal,
    wherein the bi-directional switching bridge arm comprises:
        a first flow direction switch unit; and
        a second flow direction switch unit,
        when the first flow direction switch unit turns on, current in the bi-directional switching bridge arm flows to the midpoint terminal from the AC terminal, and when the second flow direction switch unit turns on, current in the bio-directional switching bridge arm flows to the AC terminal from the midpoint terminal, and
        wherein when a short-circuit path comprised both the bi-directional switching bridge arm and the upper switch unit or the lower switch unit, the voltage drop of the upper switch unit of the voltage drop of the lower switch unit in the short-circuit path is not less than voltage drops of the corresponding first flow direction switch unit or second flow direction switch unit.

2. The TNPC inverter device according to claim 1, wherein a rated current of the upper switch unit or the lower switch unit is not greater than a rated current of the first flow direction switch unit or the second flow direction switch unit.

3. The TNPC inverter device according to claim 1, wherein the TNPC inverter device further comprises:
    a first driving voltage generating circuit for driving the upper switch unit; and
    a second driving voltage generating circuit for driving the lower switch unit,
    wherein the first driving voltage generating circuit and the second driving voltage generating circuit respectively have a stabilivolt for making the static driving voltages generated by both the first driving voltage generating circuit and the second driving voltage generating circuit to be less than the static driving voltage of the first flow direction switch unit or the second flow direction switch unit.

4. The TNPC inverter device according to claim 1, wherein a transconductance of the upper switch unit or the lower switch unit is less than a transconductance of the first flow direction switch unit or the second flow direction switch unit.

5. The TNPC inverter device according to claim 1, wherein the TNPC inverter device further comprises:
    a first driving voltage generating circuit configured with a first connection resistor for driving the upper switch unit;
    a second driving voltage generating circuit configured with a second connection resistor for driving the lower switch unit;
    a third driving voltage generating circuit configured with a third connection resistor for driving the first flow direction switch unit; and
    a fourth driving voltage generating circuit configured with a fourth connection resistor for driving the second flow direction switch unit;
    wherein value of the first or second connection resistor is smaller than value of the third or fourth connection resistor to reduce the loss of the first driving voltage generating circuit or the second driving voltage generating circuit.

6. The TNPC inverter device according to claim 1, wherein a voltage drop of any one of the switches constituting the upper switch unit and the lower switch unit is greater than 5.6V when a short-circuit path comprised the upper switch unit or the lower switch unit.

7. The TNPC inverter device according to claim 1, wherein the TNPC inverter module is encapsulated in a packaged case with pins, the short circuit detecting module is outside of the packaged case.

8. The TNPC inverter device according to claim 1, wherein a static driving voltage of the upper switch unit or the lower switch unit is less than a static driving voltage of the first flow direction switch unit or the second flow direction switch unit.

9. The TNPC inverter device according to claim 8, wherein the TNPC inverter device further comprises:
   a first driving voltage generating circuit for driving the upper switch unit comprised a first voltage stabilizing integrated circuit and a first voltage adjusting resistor; and
   a second driving voltage generating circuit for driving the lower switch unit comprised a second voltage stabilizing integrated circuit and a second voltage adjusting resistor,
   wherein adjusting the first or second voltage stabilizing integrated circuits by the first or second voltage adjusting resistors to make the static driving voltages generated by both the first driving voltage generating circuit and the second driving voltage generating circuit are less than the static driving voltage of the first flow direction switch unit or the second flow direction switch unit.

10. The device TNPC inverter according to claim 1, wherein any one of the upper switch unit, the lower switch unit, the first flow direction switch unit and the second flow direction switch unit is formed of one switch, or formed of a plurality of switches connected in parallel or in series.

11. The TNPC inverter device according to claim 10, wherein the switch is a controllable switch.

12. The TNPC inverter device according to claim 10, wherein the first flow direction switch unit and the second flow direction switch unit are connected in series, and any one of the switches is anti-parallelly connected with a diode.

13. The TNPC inverter device according to claim 10, wherein the first flow direction switch unit and the second flow direction switch unit are connected in parallel, each of the switches constituting any one of the first flow direction switch unit and the flow direction switch unit is connected with a diode in reverse series, and each of the switches constituting any one of the upper switch unit and the lower switch unit is anti-parallelly connected with a diode.

14. A method for detecting a short-circuit in a TNPC inverter device, wherein the TNPC inverter device comprises:
   a TNPC inverter module comprising:
      a first DC terminal;
      a second DC terminal;
      an AC terminal;
      a capacitor bridge arm;
      an inverting bridge arm comprising an upper switch unit and a lower switch unit which are connected in series; and
      a bi-directional switching bridge arm; and
   a short circuit detecting module mainly consisting of an upper switch detecting unit and a lower switch detecting unit,
   wherein ends of the capacitor bridge arm and ends of the inverting bridge arm are correspondingly connected to the first DC terminal and the second DC terminal, ends of the bi-directional switching bridge arm are correspondingly connected to a midpoint of the capacitor bridge arm and a midpoint of the inverting bridge arm, the AC terminal is the midpoint of the inverting bridge arm; and
   wherein the upper switch detecting unit is configured to detect a voltage drop of the upper switch unit, and the lower switch detecting unit is configured to detect a voltage drop of the lower switch unit,
   wherein the TNPC inverter module further comprises a midpoint terminal, and the midpoint of the capacitor bridge arm is electrically connected with the midpoint terminal,
   wherein the bi-directional switching bridge arm comprises:
      a first flaw direction switch unit, and
      a second flow direction switch unit,
      when the first flow direction switch unit turns on, current in the bi-directional switching bridge arm flows to the midpoint terminal from the AC terminal, and when the second flow direction switch unit turns on, current in the bi-directional switching bridge arm flows to the AC terminal from the midpoint terminal, and
   wherein when a short-circuit path comprised both the bi-directional switching bridge arm and the upper switch unit or the lower switch unit, the voltage drop of the upper switch unit or the voltage drop of the lower switch unit in the short-circuit path is not less than voltage drops of the corresponding first flow direction switch unit or second flow direction switch unit, and
   the method comprising:
      merely detecting voltage drops of the upper switch unit and the lower switch unit in the TNPC inverter module of the TNPC inverter device; and
      making a judgment about the occurrence of a short-circuit in the TNPC inverter module based on the comparison result of the voltage drop of the upper switch unit or the lower switch unit and a reference value amendments to the figures and claims and the following remarks.

* * * * *